US010097160B2

(12) United States Patent
Kuwahara et al.

(10) Patent No.: US 10,097,160 B2
(45) Date of Patent: Oct. 9, 2018

(54) LADDER-TYPE FILTER, DUPLEXER, AND MODULE

(71) Applicant: TAIYO YUDEN CO., LTD., Tokyo (JP)

(72) Inventors: Eiji Kuwahara, Tokyo (JP); Yuki Endo, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 71 days.

(21) Appl. No.: 15/166,631

(22) Filed: May 27, 2016

(65) Prior Publication Data

US 2016/0359470 A1 Dec. 8, 2016

(30) Foreign Application Priority Data

Jun. 5, 2015 (JP) ................... 2015-115178

(51) Int. Cl.
*H03H 9/54* (2006.01)
*H03H 9/64* (2006.01)
(Continued)

(52) U.S. Cl.
CPC .......... *H03H 9/542* (2013.01); *H03H 7/1775* (2013.01); *H03H 7/1783* (2013.01); *H03H 9/0566* (2013.01); *H03H 9/568* (2013.01); *H03H 9/605* (2013.01); *H03H 9/6483* (2013.01); *H03H 9/706* (2013.01); *H03H 9/725* (2013.01)

(58) Field of Classification Search
CPC .. H03H 7/1758; H03H 7/1775; H03H 7/1783; H03H 7/1791; H03H 9/0566; H03H 9/542; H03H 9/568; H03H 9/605; H03H 9/6483; H03H 9/706; H03H 9/725

USPC ................. 333/133, 189, 193, 195
See application file for complete search history.

(56) References Cited

U.S. PATENT DOCUMENTS

| 5,905,418 A * | 5/1999 | Ehara ................... H03H 9/0576 |
| | | 333/133 |
| 7,479,847 B2 * | 1/2009 | Yamakawa .............. H03H 9/25 |
| | | 333/133 |

(Continued)

FOREIGN PATENT DOCUMENTS

| JP | 9-261002 A | 10/1997 |
| JP | 9-321573 A | 12/1997 |

(Continued)

OTHER PUBLICATIONS

Japanese Office Action dated Nov. 7, 2017, in a counterpart Japanese patent application No. 2015-115178.

(Continued)

*Primary Examiner* — Barbara Summons
(74) *Attorney, Agent, or Firm* — Chen Yoshimura LLP

(57) ABSTRACT

A ladder-type filter includes: one or more series resonators connected in series between an input terminal and an output terminal; two or more parallel resonators connected in parallel between the input terminal and the output terminal; a first inductor connected in series between at least two nodes, each of the at least two nodes being located between a corresponding parallel resonator of at least two parallel resonators of the two or more parallel resonators and ground; and a first capacitor connected in series with the first inductor between the at least two nodes.

10 Claims, 22 Drawing Sheets

(51) Int. Cl.
*H03H 9/70* (2006.01)
*H03H 9/72* (2006.01)
*H03H 9/05* (2006.01)
*H03H 9/56* (2006.01)
*H03H 9/60* (2006.01)
*H03H 7/01* (2006.01)

(56) References Cited

U.S. PATENT DOCUMENTS

2004/0085161 A1    5/2004    Kushitani et al.
2006/0267708 A1*    11/2006    Matsuda ................ H03H 9/568
                                                                                         333/133
2008/0197941 A1    8/2008    Suzuki et al.

FOREIGN PATENT DOCUMENTS

| JP | 10-163808 | * | 6/1998 |
| JP | 2004-72411 A | | 3/2004 |
| JP | 2005-176321 A | | 6/2005 |
| JP | 2006-014377 | * | 1/2006 |
| JP | 2006-333012 | * | 12/2006 |
| JP | 2008-205947 A | | 9/2008 |
| JP | 2012-49758 A | | 3/2012 |
| JP | 2012-175438 A | | 9/2012 |

OTHER PUBLICATIONS

Japanese Office Action dated May 8, 2018, in a counterpart Japanese patent application No. 2015-115178.

* cited by examiner

LADDER-TYPE FILTER, DUPLEXER, AND MODULE

CROSS-REFERENCE TO RELATED APPLICATION

This application is based upon and claims the benefit of priority of the prior Japanese Patent Application No. 2015-115178, filed on Jun. 5, 2015, the entire contents of which are incorporated herein by reference.

FIELD

A certain aspect of the present invention relates to a ladder-type filter, a duplexer, and a module.

BACKGROUND

Ladder-type filters are used in high frequency communication systems. It has been known to connect a resonant circuit including an inductor and a capacitor connected in parallel between the parallel resonator of a ladder-type filter and ground as disclosed in Japanese Patent Application Publication Nos. 9-261002, 9-321573, and 2008-205947 (Patent Documents 1 through 3). It has been also known to interconnect the ground terminals of two or more parallel resonators by a capacitor or the like as disclosed in Japanese Patent Application Publication Nos. 2004-72411 and 2012-175438 (Patent Documents 4 and 5).

The provision of the resonant circuit disclosed in Patent Documents 1 through 3 allows an attenuation pole to be formed outside the passband of the ladder-type filter. However, the resonant circuit forms a single attenuation pole. Therefore, two or more attenuation poles are not formed.

SUMMARY OF THE INVENTION

According to a first aspect of the present invention, there is provided a ladder-type filter including: one or more series resonators connected in series between an input terminal and an output terminal; two or more parallel resonators connected in parallel between the input terminal and the output terminal; a first inductor connected in series between at least two nodes, each of the at least two nodes being located between a corresponding parallel resonator of at least two parallel resonators of the two or more parallel resonators and ground; and a first capacitor connected in series with the first inductor between the at least two nodes.

According to a second aspect of the present invention, there is provided a ladder-type filter including: one or more series resonators connected in series between an input terminal and an output terminal; two or more parallel resonators connected in parallel between the input terminal and the output terminal; a second inductor connected in series between at least one parallel resonator of the two or more parallel resonators and ground; a second capacitor connected in parallel to the second inductor between the at least one parallel resonator and the ground; and a third inductor connected in parallel to the second inductor and connected in series with the second capacitor between the at least one parallel resonator and the ground.

According to a third aspect of the present invention, there is provided a duplexer including: a transmit filter connected between a transmit terminal and a common terminal; and a receive filter connected between a receive terminal and the common terminal, wherein at least one of the transmit filter and the receive filter is the above ladder-type filter.

According to a fourth aspect of the present invention, there is provided a module including: the above ladder-type filter.

DETAILED DESCRIPTION

Hereinafter, embodiments of the present invention will be described with reference to accompanying drawings.

First Embodiment

Figure 1A:
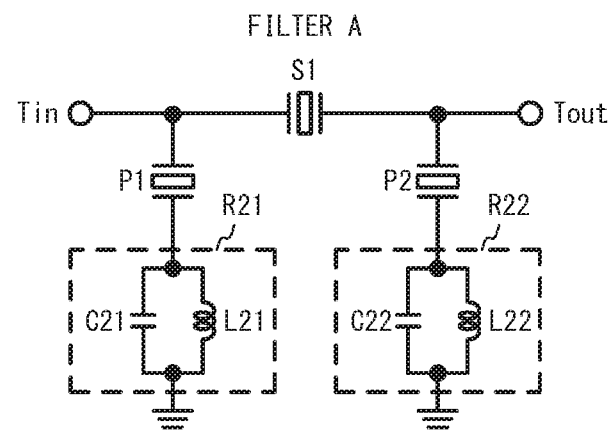
FIG. 1A and FIG. 1B are circuit diagrams of a filter A (a first comparative example) and a filter B (a first embodiment), respectively.
Figure 1B:
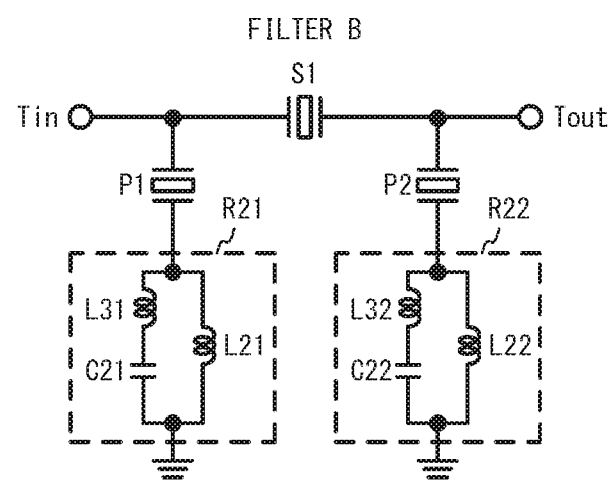

The attenuation characteristic of each filter was simulated. FIG. 1A and FIG. 1B are circuit diagrams of a filter A (a first comparative example) and a filter B (a first embodiment), respectively. As illustrated in FIG. 1A, the filter A includes a series resonator S1, parallel resonators P1 and P2, and resonant circuits R21 and R22. The series resonator S1 is connected in series between an input terminal Tin and an output terminal Tout. The parallel resonators P1 and P2 are connected in parallel between the input terminal Tin and the output terminal Tout. The resonant circuit R21 is connected between the ground terminal of the parallel resonator P1 and ground, and the resonant circuit R22 is connected between the ground terminal of the parallel resonator P2 and ground.

The resonant circuit R21 includes an inductor L21 and a capacitor C21. The inductor L21 and the capacitor C21 are electrically connected between the ground terminal of the parallel resonator P1 and the ground. The resonant circuit R22 includes an inductor L22 and a capacitor C22. The inductor L22 and the capacitor C22 are electrically connected between the ground terminal of the parallel resonator P2 and the ground.

As illustrated in FIG. 1B, in the filter B, the resonant circuit R21 includes an inductor L31, and the resonant circuit R22 includes an inductor L32. The inductor L31 is connected in series with the capacitor C21 and is connected in parallel to the inductor L21. The inductor L32 is connected in series with the capacitor C22 and is connected in parallel to the inductor L22. Other configurations are the same as those of the filter A, and the description thereof is omitted.

The inductance of each inductor and the capacitance of each capacitor of the filters A and B used for the simulation are as follows. Simulated as the filter A were filters A1 and A2 of which the capacitances of the capacitors C21 and the inductances of the inductors L21 of the resonant circuits R21 differ from each other.
Filter A1:
Resonant circuit R21: C21=0.85 pF, L21=0.33 nH
Resonant circuit R22: C22=10 pF, L22=0.32 nH
Filter A2:
Resonant circuit R21: C21=13.45 pF, L21=0.126 nH
Resonant circuit R22: C22=10 pF, L22=0.32 nH
Filter B:
Resonant circuit R21: C21=0.85 pF, L21=0.33 nH, L31=1.8 nH
Resonant circuit R22: C22=10 pF, L22=0.32 nH, L32=0.001 nH The capacitance of the capacitor C22 is the same and the inductance of the inductor L22 is the same among the filters A1, A2, and B. The capacitance of the capacitor C21 and the inductance of the inductor L21 of the filter A1 are the same as those of the filter B. The capacitance of the capacitor C21 and the inductance of the inductor L21 of the filter A2 are changed from those of the filter A1 so that the frequency of the attenuation pole of the filter A2 corresponds to that of the filter B.

Figure 2A:
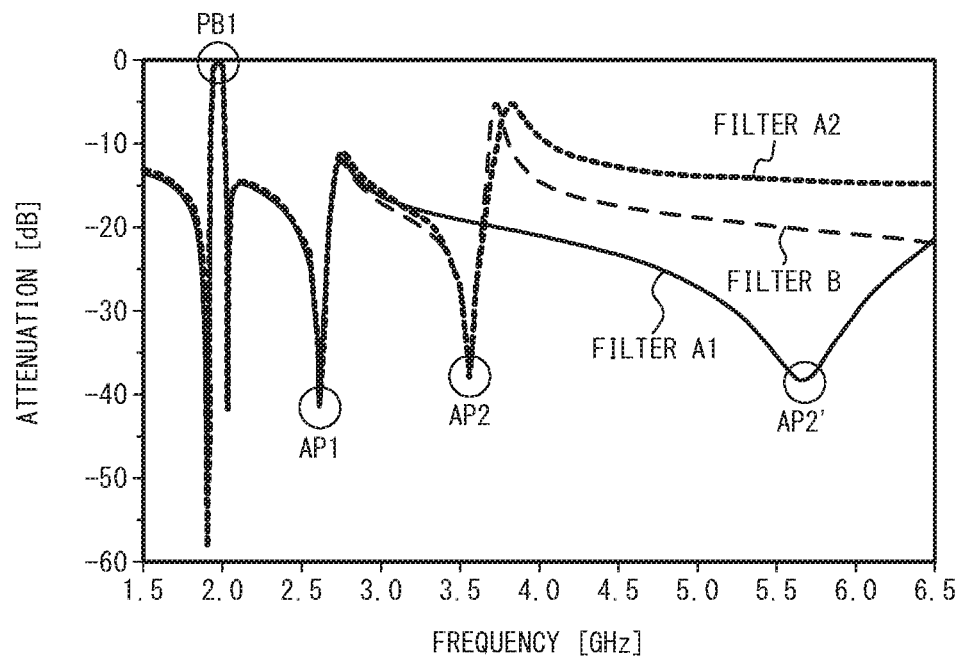
FIG. 2A and FIG. 2B illustrate the attenuation characteristics of the filters A and B.
Figure 2B:
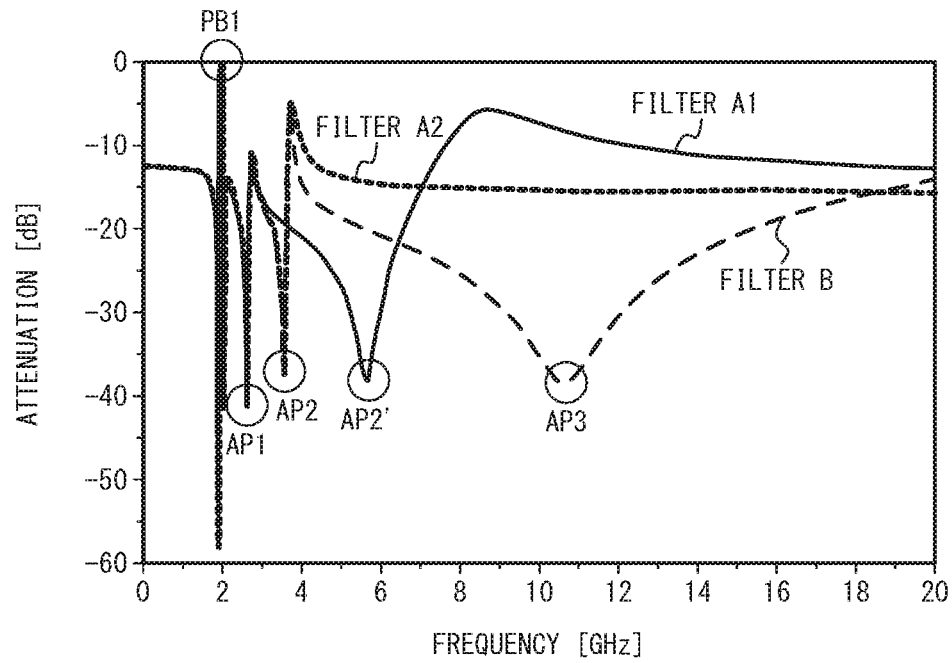

FIG. 2A and FIG. 2B illustrate the attenuation characteristics of the filters A and B. FIG. 2B illustrates a wider band than FIG. 2A. As illustrated in FIG. 2A and FIG. 2B, passbands PB1 of the filters A1, A2, and B are approximately 2 GHz. The resonant circuit R22 of each of the filters A1, A2, and B forms an attenuation pole AP1 at approximately 2.6 GHz. In the filter A1, the resonant circuit R21 forms an attenuation pole AP2' at approximately 5.7 GHz. In the filter A2, as the capacitance of the capacitor C21 and the inductance of the inductor L21 of the resonant circuit R21 were changed, the attenuation pole AP2' has a frequency of approximately 3.5 GHz, and an attenuation pole AP2 is formed. In the filter B, since the resonant circuits R21 and R22 respectively include the inductors L31 and L32, an attenuation pole AP3 with a frequency of approximately 11.5 GHz is formed in addition to the attenuation pole AP2. The attenuation of the filter B is larger than the attenuation of the filter A2 at frequencies equal to approximately 4 GHz or greater.

In the filter B, when the inductance of the inductor L31 is increased, the attenuation pole AP1 remains unchanged, and the attenuation poles AP2 and AP3 shift to lower frequencies. When the inductance of the inductor L31 is reduced, the attenuation pole AP1 remains unchanged, and the attenuation poles AP2 and AP3 shift to higher frequencies. When the inductance of the inductor L32 is increased, the attenuation pole AP2 remains unchanged, and the attenuation poles AP1 and AP3 shift to lower frequencies. When the inductance of the inductor L32 is reduced, the attenuation pole AP2 remains unchanged, and the attenuation poles AP1 and AP3 shift to higher frequencies. Accordingly, the attenuation pole AP1 is formed by mainly the resonant circuit R22, and the attenuation pole AP2 is formed by mainly the resonant circuit R21. The attenuation pole AP3 is considered to be formed by mainly the inductors L31 and L32.

As described above, compared to the filter A2, the filter B can increase the number of attenuation poles without changing the attenuation characteristics of the attenuation poles AP1 and AP2.

Figure 3:
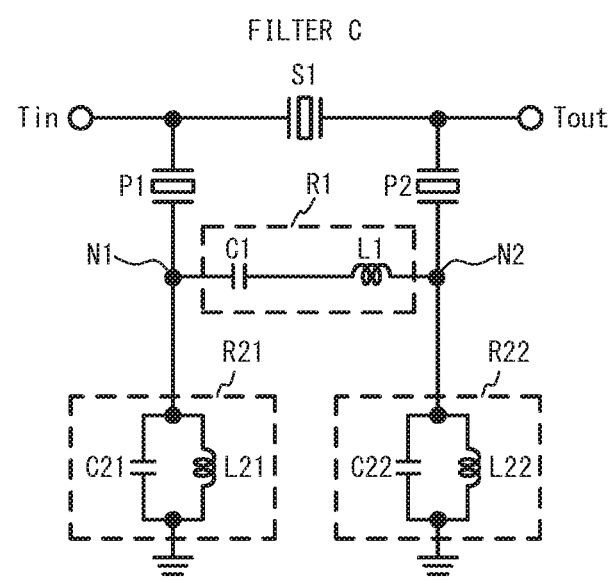
FIG. 3 is a circuit diagram of a filter C (a first variation of the first embodiment)

FIG. 3 is a circuit diagram of a filter C (a first variation of the first embodiment). As illustrated in FIG. 3, in the filter C, a resonant circuit R1 is connected between a node N1 between the ground terminal of the parallel resonator P1 and the resonant circuit R21 and a node N2 between the ground terminal of the parallel resonator P2 and the resonant circuit R22. The resonant circuit R1 includes a capacitor C1 and an inductor L1 connected in series between the nodes N1 and N2. Other configurations are the same as those of the filter A1, and the description thereof is omitted.

The inductance of each inductor and the capacitance of each capacitor of the filter C used for the simulation are as follows.
Filter C:
Resonant circuit R21: C21=0.85 pF, L21=0.33 nH
Resonant circuit R22: C22=10 pF, L22=0.32 nH
Resonant circuit R1: C1=0.34 pF, L1=2.1 nH Each capacitance and each inductance of the resonant circuits R21 and R22 of the filter C are the same as those of the filter A1.

Figure 4A:
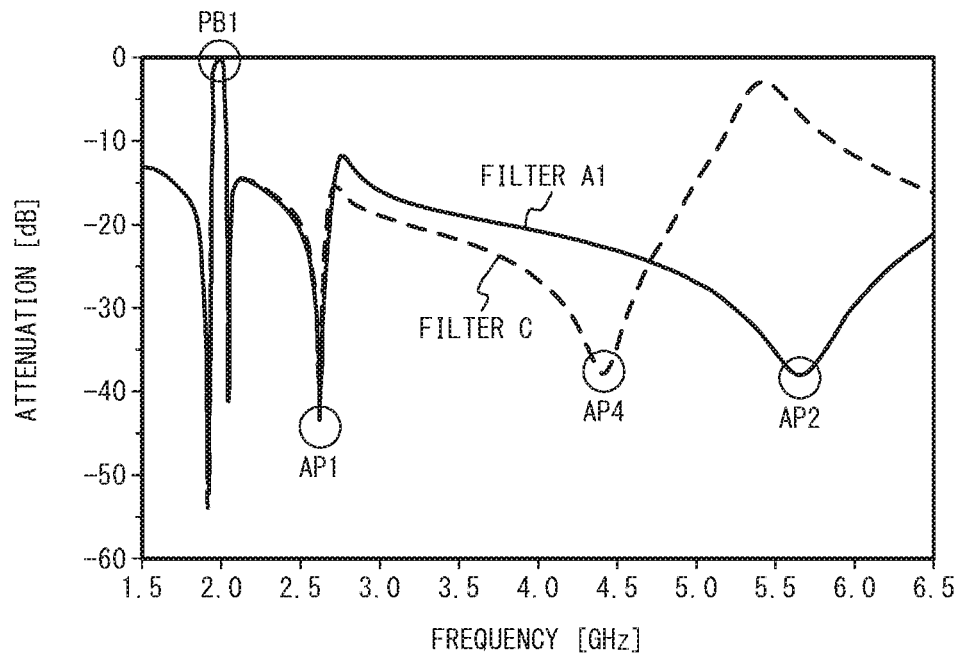
FIG. 4A and FIG. 4B illustrate the attenuation characteristics of the filters A and C.
Figure 4B:
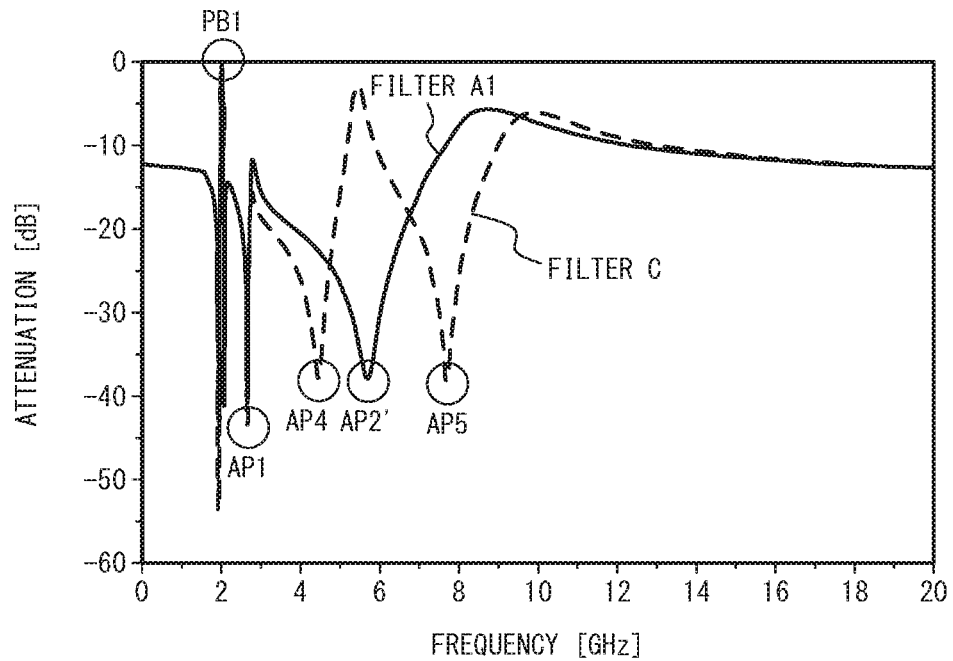

FIG. 4A and FIG. 4B illustrate the attenuation characteristics of the filters A and C. FIG. 4B illustrate a wider band than FIG. 4A. As illustrated in FIG. 4A and FIG. 4B, in the filter C, the attenuation pole AP2' of the filter A1 becomes an attenuation pole AP4 at approximately 4.4 GHz and an attenuation pole AP5 at approximately 7.8 GHz.

In the filter C, when the capacitance of the capacitor C1 is increased, the attenuation pole AP1 remains unchanged, and the attenuation poles AP4 and AP5 shift lower frequencies. When the capacitance of the capacitor C1 is reduced, the attenuation pole AP1 remains unchanged, and the attenuation poles AP4 and AP5 shift to higher frequencies. When the inductance of the inductor L1 is increased, the attenuation pole AP1 remains unchanged, and the attenuation poles AP3 and AP4 shift to lower frequencies. When the inductance of the inductor L1 is reduced, the attenuation pole AP1 remains unchanged, and the attenuation poles AP3 and AP4 shift to higher frequencies. Accordingly, the attenuation poles AP3 and AP4 are considered to be formed by mainly the resonant circuit R1.

As described above, the filter C can increase the number of attenuation poles compared to the filter A1. The newly formed attenuation poles AP4 and AP5 have attenuation characteristics further steeper than that of the attenuation pole AP2'.

Figure 5:
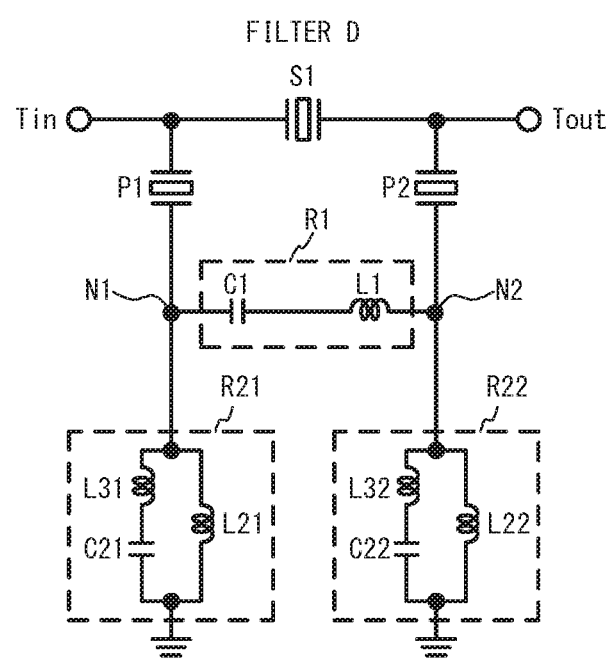
FIG. 5 is a circuit diagram of a filter D (a second variation of the first embodiment)

FIG. 5 is a circuit diagram of a filter D (a second variation of the first embodiment). As illustrated in FIG. 5, in the filter D, the resonant circuit R1 is connected between the node N1 between the ground terminal of the parallel resonator P1 and the resonant circuit R21 and the node N2 between the ground terminal of the parallel resonator P2 and the resonant circuit R22. The resonant circuit R1 includes the capacitor C1 and the inductor L1 connected in series between the nodes N1 and N2. Other configurations are the same as those of the filter B, and the description thereof is omitted.

The inductance of each inductor and the capacitance of each capacitor of the filter D used for the simulation are as follows.
Filter D:
Resonant circuit R21: C21=0.85 pF, L21=0.33 nH, L31=1.8 nH
Resonant circuit R22: C22=10 pF, L22=0.32 nH, L32=0.001 nH
Resonant circuit R1: C1=0.34 pF, L1=2.1 nH Each capacitance and each inductance of the resonant circuits R21 and R22 of the filter D are the same as those of the filter A1. The capacitance of the capacitor C1 and the inductance of the inductor L1 of the resonant circuit R1 of the filter D are the same as those of the filter C.

Figure 6A:
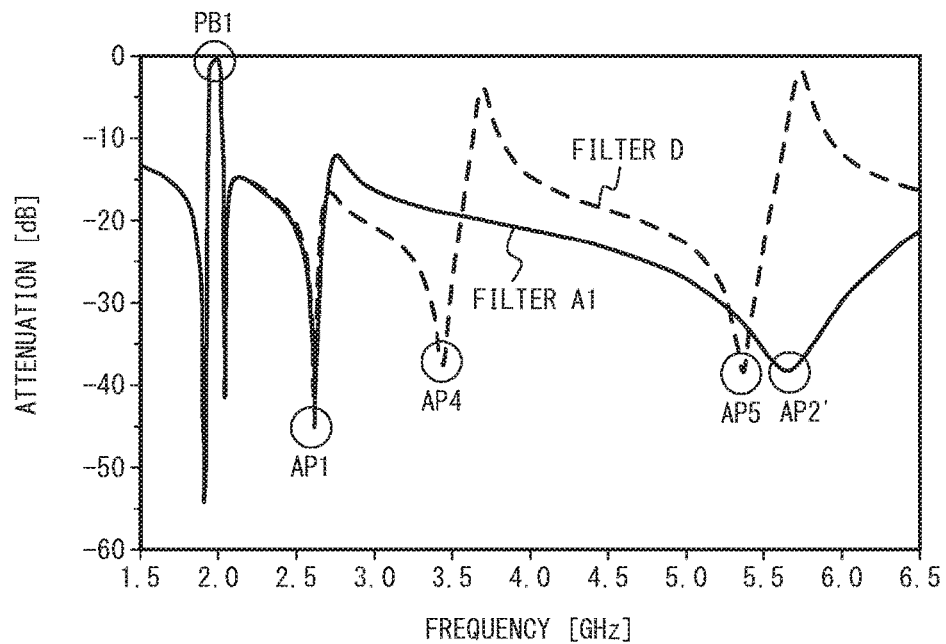
FIG. 6A and FIG. 6B illustrate the attenuation characteristics of the filters A and D.
Figure 6B:
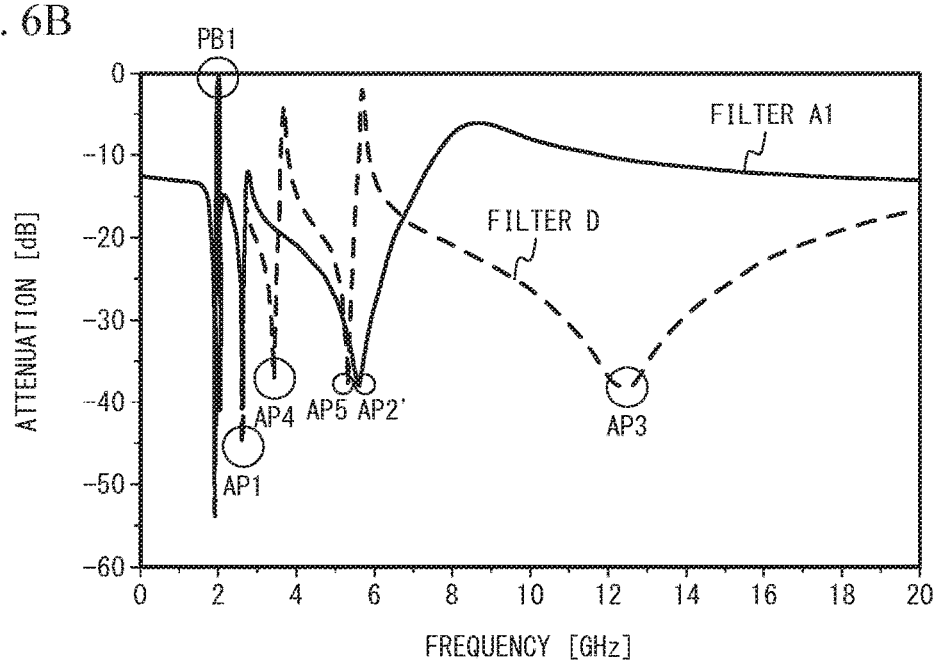

FIG. 6A and FIG. 6B illustrate the attenuation characteristics of the filters A and D. FIG. 6B illustrates a wider band than FIG. 6A. As illustrated in FIG. 6A and FIG. 6B, in the filter D, the attenuation pole AP2' of the filter A1 becomes three: the attenuation pole AP3 at approximately 12.5 GHz; the attenuation pole AP4 at approximately 3.5 GHz; and the attenuation pole AP5 at approximately 5.4 GHz.

In the filter D, when the inductance of the inductor L31 is increased, the attenuation pole AP1 remains unchanged, and the attenuation poles AP3 through AP5 shift to lower frequencies. When the inductance of the inductor L31 is reduced, the attenuation pole AP1 remains unchanged, and the attenuation poles AP3 through AP5 shift to higher frequencies. When the inductance of the inductor L32 is increased, the attenuation pole AP4 remains unchanged, and the attenuation poles AP1, AP3, and AP5 shift to lower frequencies. When the inductance of the inductor L32 is reduced, the attenuation pole AP4 remains unchanged, and the attenuation poles AP1, AP3, and AP5 shift to higher frequencies. When the capacitance of the capacitor C1 is increased, the attenuation pole AP1 remains unchanged, and the attenuation poles AP3 through AP5 shift lower frequencies. When the inductance of the inductor C1 is reduced, the attenuation pole AP1 remains unchanged and the attenuation poles AP3 through AP5 shift to higher frequencies. When the inductance of the inductor L1 is increased, the attenuation poles AP1 and AP4 remain unchanged, and the attenuation poles AP3 and AP5 shift to lower frequencies. When the inductance of the inductor L1 is reduced, the attenuation poles AP1 and AP4 remain unchanged, and the attenuation poles AP3 and AP5 shift to higher frequencies. Accordingly, the attenuation poles AP3 through AP5 are considered to be formed by mainly the resonant circuit R1 and the inductors L31 and L32.

As described above, the filter D can increase the number of attenuation poles by two compared to the filter A1.

Figure 7A:
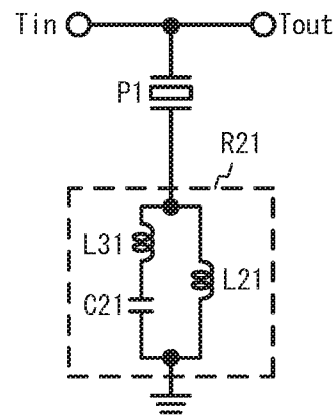
FIG. 7A and FIG. 7B are circuit diagrams of parallel arms A and B, respectively.
Figure 7B:
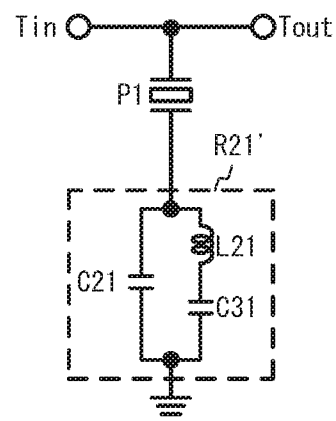

Simulation was conducted on a case where the resonant circuit R21 is replaced with a resonator. FIG. 7A and FIG. 7B are circuit diagrams of parallel arms A and B, respectively. As illustrated in FIG. 7A, the parallel arm A is a parallel arm including the parallel resonator P1 of the filter B. As illustrated in FIG. 7B, the parallel arm B includes a resonant circuit R21'. The resonant circuit R21' does not include the inductor L31, and include a capacitor C31 connected in series with the inductor L21. The resonant circuit R21' corresponds to an equivalent circuit of an acoustic wave resonator. Other configurations are the same as those of the parallel arm A, and the description thereof is omitted.

Figure 8A:
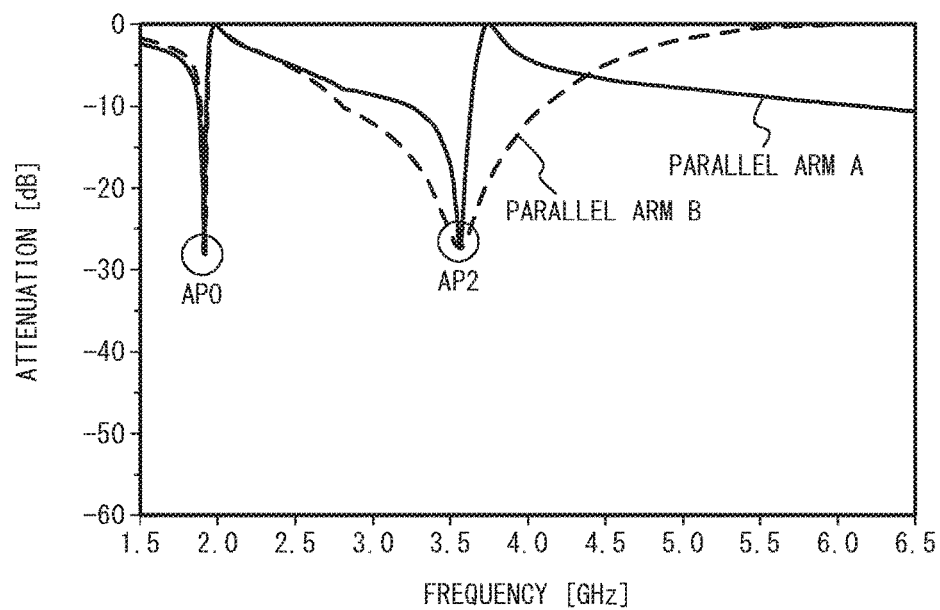
FIG. 8A and FIG. 8B illustrate the attenuation characteristics of the parallel arms A and B.
Figure 8B:
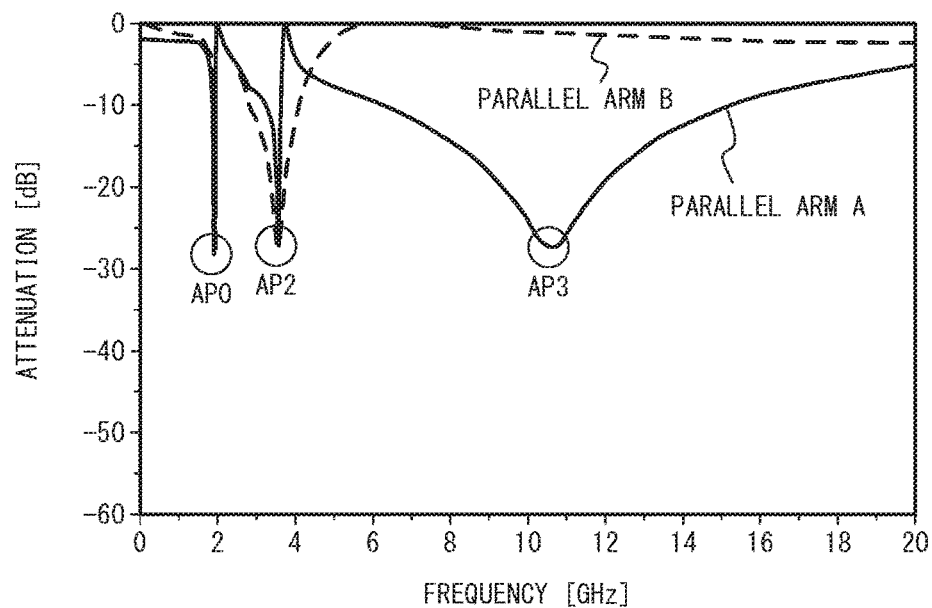

The inductance of each inductor and the capacitance of each capacitor of the parallel arms A and B used for the simulation are as follows.
Parallel arm A:
Resonant circuit R21: C21=0.85 pF, L21=0.33 nH, L31=1.8 nH
Parallel arm B:
Resonant circuit R21': C21=0.85 pF, L21=0.8 nH, C31=10.3 pF FIG. 8A and FIG. 8B illustrate the attenuation characteristics of the parallel arms A and B. FIG. 8B illustrate a wider band than FIG. 8A. As illustrated in FIG. 8A and FIG. 8B, in both the parallel arms A and B, an attenuation pole AP0 due to the parallel resonator P1 is formed at approximately 1.8 GHz, and the attenuation pole AP2 due to the resonant circuits R21 and R21' is formed at approximately 3.6 GHz. In the parallel arm A, the attenuation pole AP3 is formed at approximately 10.5 GHz. The attenuation characteristic of the attenuation pole AP2 in the parallel arm A is steeper than that in the parallel arm B.

As described above, the number of attenuation poles formed in the parallel arm B is less than the number of attenuation poles formed in the parallel arm A. The attenuation characteristic of the attenuation pole is also gentle. Accordingly, unlike the filter B, the number of attenuation poles does not increase when the resonant circuit R21 of the filter B is replaced with an acoustic wave resonator.

Figure 9A:
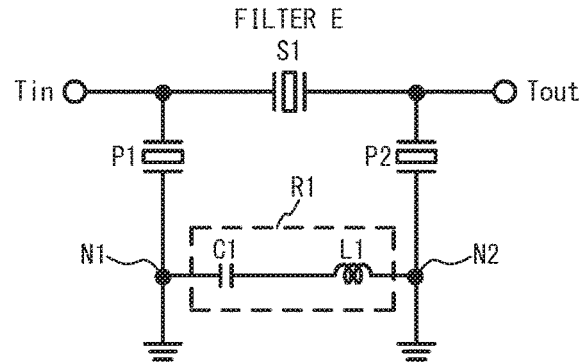
FIG. 9A through FIG. 9C are circuit diagrams of filters E through G in accordance with other variations of the first embodiment, respectively.

FIG. 9A through FIG. 10B are circuit diagrams of filters E through I in accordance with other variations of the first embodiment, respectively. As illustrated in FIG. 9A, unlike the filter D, the filter E includes neither of the resonant circuits R21 and R22. Other configurations are the same as those of the filter D, and the description thereof is omitted. As in the filter E, at least one of the resonant circuits R21 and R22 may be omitted.

Figure 9B:
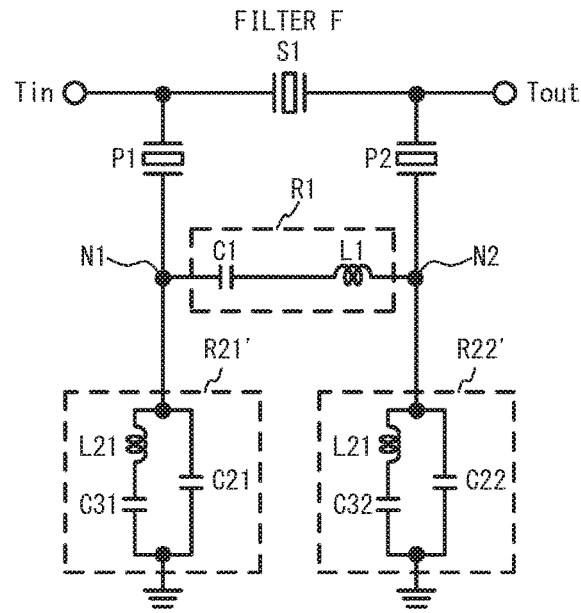

As illustrated in FIG. 9B, compared with the filter D, in the filter F, the resonant circuits R21 and R22 are respectively replaced with resonant circuits R21' and R22'. The resonant circuit R21' does not include the inductor L31, and includes the capacitor C31 connected in series with the inductor L21. The resonant circuit R22' does not include the inductor L32, and includes a capacitor C32 connected in series with the inductor L22. Other configurations are the same as those of the filter D, and the description thereof is omitted. As in the filter F, at least the resonant circuit R21 may be the resonant circuit R21', at least the resonant circuit R22 may be the resonant circuit R22', or the resonant circuits R21 and R22 may be the resonant circuits R21' and R22'.

Figure 9C:
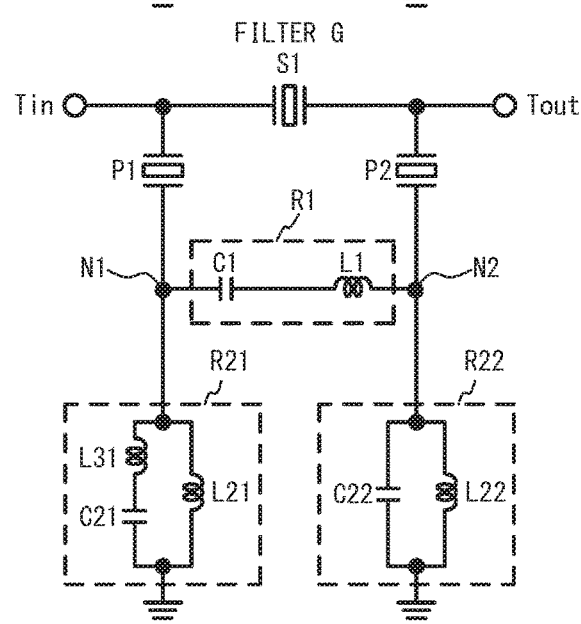

As illustrated in FIG. 9C, compared with the filter D, the filter G does not include the inductor L32 in the resonant circuit R22. Other configurations are the same as those of the filter D, and the description thereof is omitted. As in the filter G, at least one of the resonant circuits R21 and R22 may include neither of inductors L31 and L32.

Figure 10A:
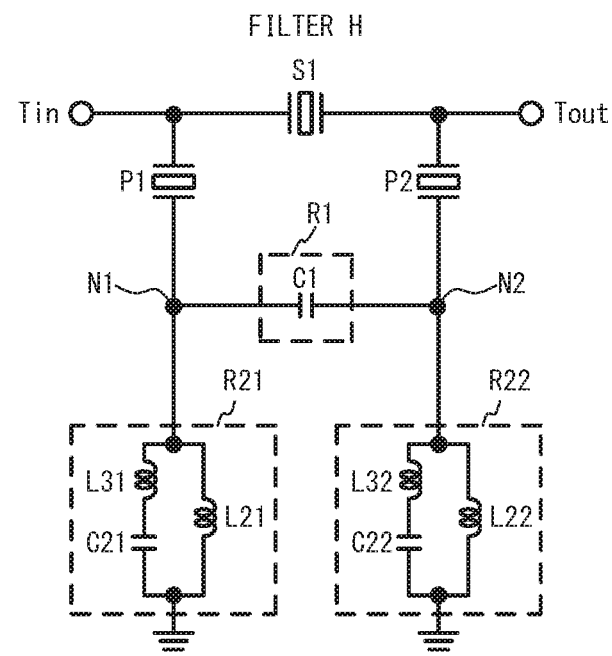
FIG. 10A and FIG. 10B are circuit diagrams of filters H and I in accordance with other variations of the first embodiment, respectively.

As illustrated in FIG. 10A, compared with the filter D, the filter H does not include the inductor L1 in the resonant circuit R1. Other configurations are the same as those of the filter D, and the description thereof is omitted. As in the filter H, the resonant circuit R1 may not include the inductor L1.

Figure 10B:
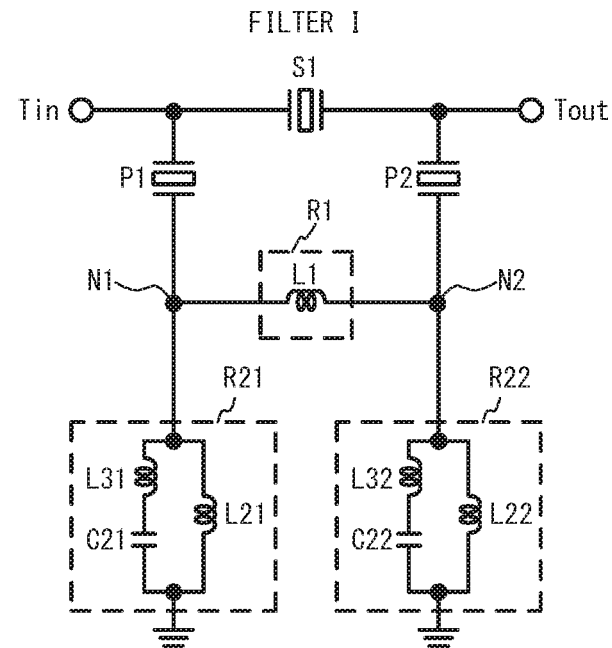

As illustrated in FIG. 10B, compared with the filter D, the filter I does not include the capacitor C1 in the resonant circuit R1. Other configurations are the same as those of the filter D, and the description thereof is omitted. As in the filter I, the resonant circuit R1 may not include the capacitor C1.

According to the first embodiment, as in the filters C through G, the inductor L1 (a first inductor) is connected in series between the nodes N1 and N2. The capacitor C1 (a first capacitor) is connected in series with the inductor L1 between the nodes N1 and N2. This configuration allows an attenuation pole with steep attenuation characteristic to be formed without deteriorating the pass characteristic.

A plurality of series resonators S1 may be provided. Three or more parallel resonators P1 and P2 may be provided. The series resonator S1 and the parallel resonators P1 and P2 may be, for example, acoustic wave resonators such as acoustic wave surface resonators, acoustic wave boundary wave resonators, Love wave resonators, or piezoelectric thin film resonators.

When three or more parallel resonators are provided, the inductor L1 and the capacitor C1 are required to be connected between at least two nodes, each of the at least two nodes being located between a corresponding parallel resonator of at least two parallel resonators of the parallel resonators and ground. That is to say, two or more resonant circuits R1 may be provided. Alternatively, some of the parallel resonators may be commonly connected to the node N1 or N2.

The inductor L21 (a second inductor) is connected between the node N1 and ground and the inductor L22 (a second inductor) is connected between the node N2 and ground. The capacitor C21 (a second capacitor) is connected in parallel to the inductor L21 between the node N1 and ground, and the capacitor C22 (a second capacitor) is connected in parallel to the inductor L22 between the node N2 and ground. This configuration allows two or more attenuation poles with steep attenuation characteristics to be formed as in the filter C illustrated in FIG. 4A and FIG. 4B.

Only one of the resonant circuits R21 and R22 may be provided. Both the resonant circuits R21 and R22 may be provided. That is to say, at least one of the inductors L21 and L22 and at least one of the capacitors C21 and C22 are required to be connected between at least one node of nodes to which the resonant circuit R1 is connected and ground.

To form many attenuation poles, both the resonant circuits R21 and R22 are preferably provided. That is to say, each of the inductors L21 and L22 and each of the capacitors C21 and C22 are preferably connected between the corresponding node of nodes to which the resonant circuit R1 is connected and ground.

Furthermore, the inductor L31 is connected in parallel to the inductor L21 and is connected in series with the capacitor C21 between the node N1 and ground, and the inductor L32 is connected in parallel to the inductor L22 and is connected in series with the capacitor C22 between the node N2 and ground. This configuration allows more attenuation poles with steep attenuation characteristics to be formed as in the filter D illustrated in FIG. 6A and FIG. 6B.

The inductors L31 and L32 are required to be connected between at least one node of nodes to which the resonant circuit R1 is connected and ground. Each of the inductors L31 and L32 is preferably connected between the corresponding node of nodes to which the resonant circuit R1 is connected and ground.

As in the filters B, H, and I, at least one of the inductor L1 and the capacitor C1 may be omitted, and the inductors L31 and L32 may be provided. This configuration allows two or more attenuation poles with steep attenuation characteristics to be formed as in the filter B illustrated in FIG. 2A and FIG. 2B.

Second Embodiment

Figure 11A:
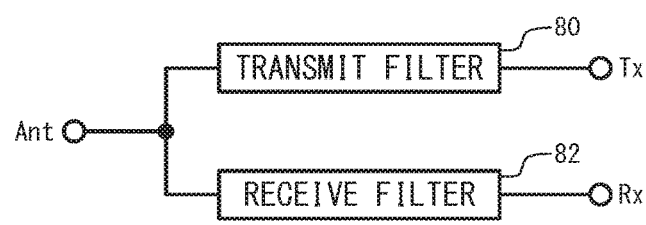
FIG. 11A is a block diagram of a duplexer including a transmit filter in accordance with a second embodiment.

A second embodiment is an exemplary transmit filter for band 2 (transmit band: 1850 to 1910 GHz, receive band: 1930 to 1990 GHz). FIG. 11A is a block diagram of a duplexer including a transmit filter in accordance with the second embodiment, and FIG. 11B is a circuit diagram of the transmit filter in accordance with the second embodiment.

As illustrated in FIG. 11A, a transmit filter 80 is connected between an antenna terminal Ant and a transmit terminal Tx, and a receive filter 82 is connected between the antenna terminal Ant and a receive terminal Rx. The transmit filter 80 outputs signals within the transmit band to the antenna terminal Ant among signals input from the transmit terminal Tx. The receive filter 82 outputs signals within the receive band to the receive terminal Rx among signals input to the antenna terminal Ant.

Figure 11B:
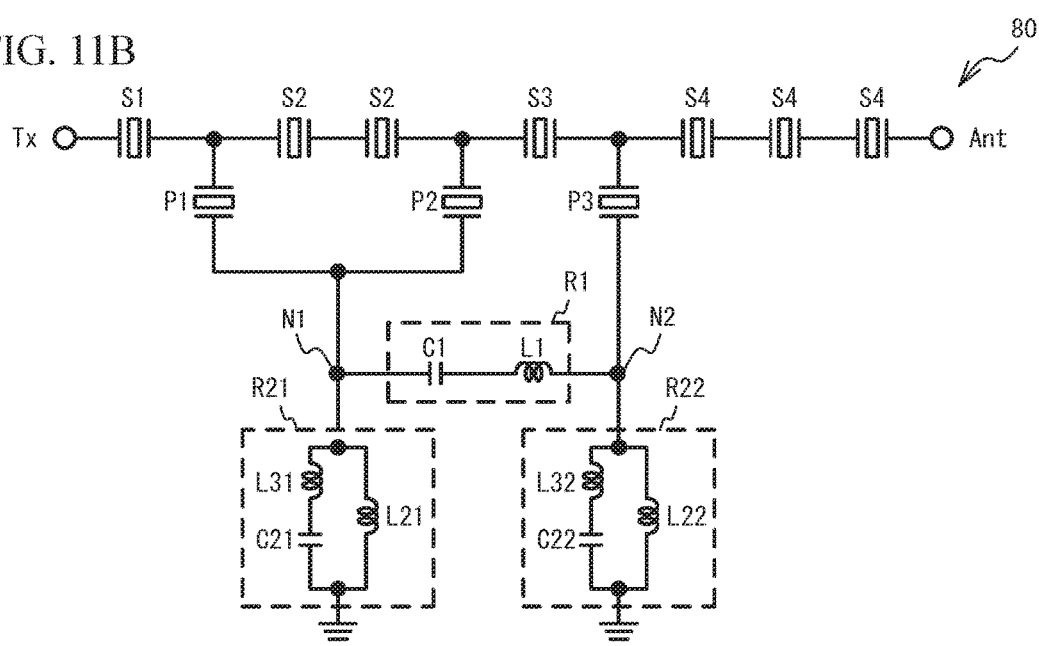
FIG. 11B is a circuit diagram of the transmit filter in accordance with the second embodiment.

As illustrated in FIG. 11B, in the transmit filter 80, series resonators S1 through S4 are connected in series and parallel resonators P1 through P3 are connected in parallel between the transmit terminal Tx and the antenna terminal Ant. The series resonator S2 is divided into two, and the series resonator S4 is divided into three. The parallel resonators P1 and P2 are commonly connected to the node N1. Other configurations are the same as those of the filter D, and the description thereof is omitted.

Figure 12:
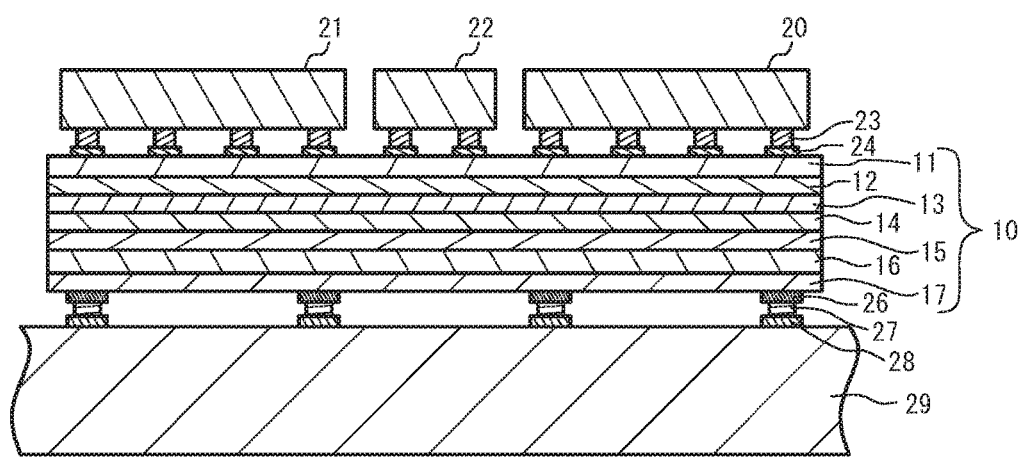
FIG. 12 is a cross-sectional view of a ladder-type filter in accordance with the second embodiment.

FIG. 12 is a cross-sectional view of a ladder-type filter in accordance with the second embodiment. As illustrated in FIG. 12 filter chips 20 and 21 and a chip component 22 are mounted on a wiring substrate 10. The wiring substrate 10 is mounted on a motherboard 29. Formed in the filter chip 20 are the series resonators S1 through S4 and the parallel resonators P1 through P3. The series resonators S1 through S4 and the parallel resonators P1 through P3 are surface acoustic wave resonators. The wiring substrate 10 is formed by stacking a plurality of layers 11 through 17. The layers 11 through 17 are insulating layers made from a resin or ceramic. Metal layers are formed on the upper surfaces and the lower surfaces of the layers 11 through 17. Penetrating electrodes penetrating through the layers 11 through 17 are formed. Pads 24 are formed on the upper surface of the wiring substrate 10. The filter chips 20 and 21 are flip-chip mounted on the pads 24 with use of solder or gold bumps 23. The chip component 22 is mounted on the pads 24. Foot pads 26 are formed on the lower surface of the wiring substrate 10. Pads 28 formed on the upper surface of the motherboard 29 are connected to the foot pads 26 with use of solder 27.

Figure 15A:
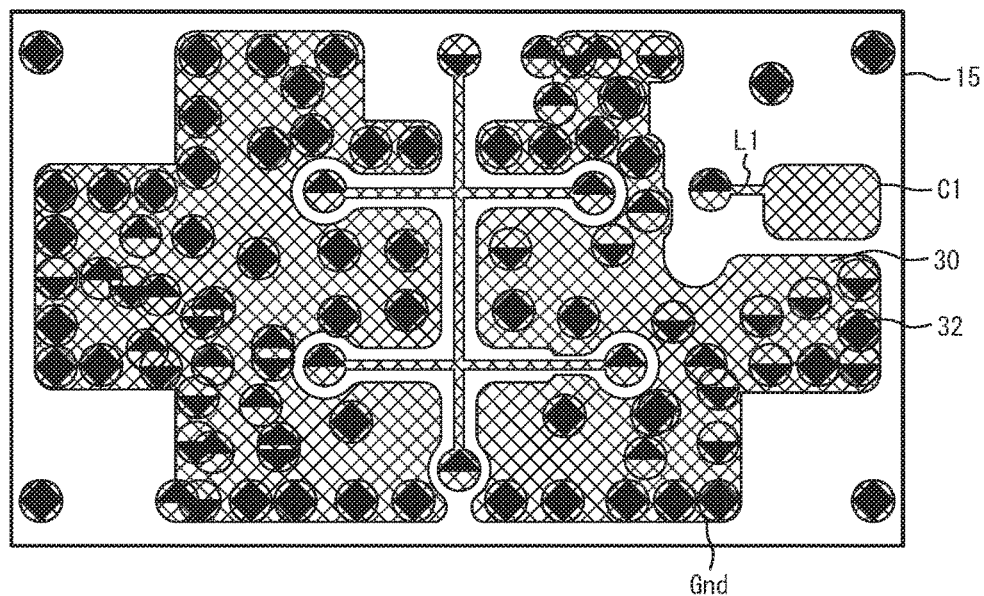
FIG. 15A and FIG. 15B are plan views (No. 3) of layers of the wiring substrate.
Figure 15B:
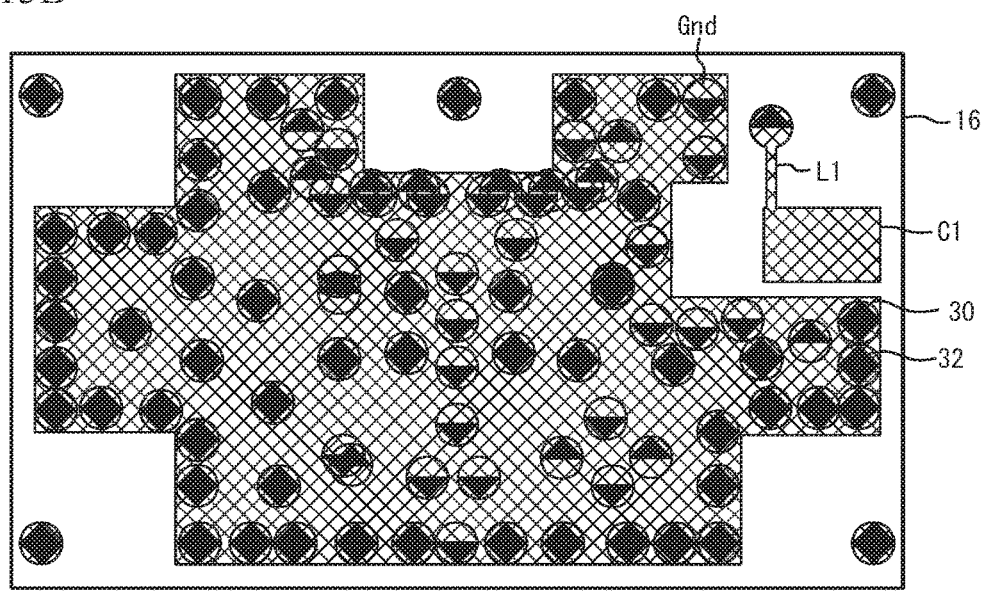
Figure 16A:
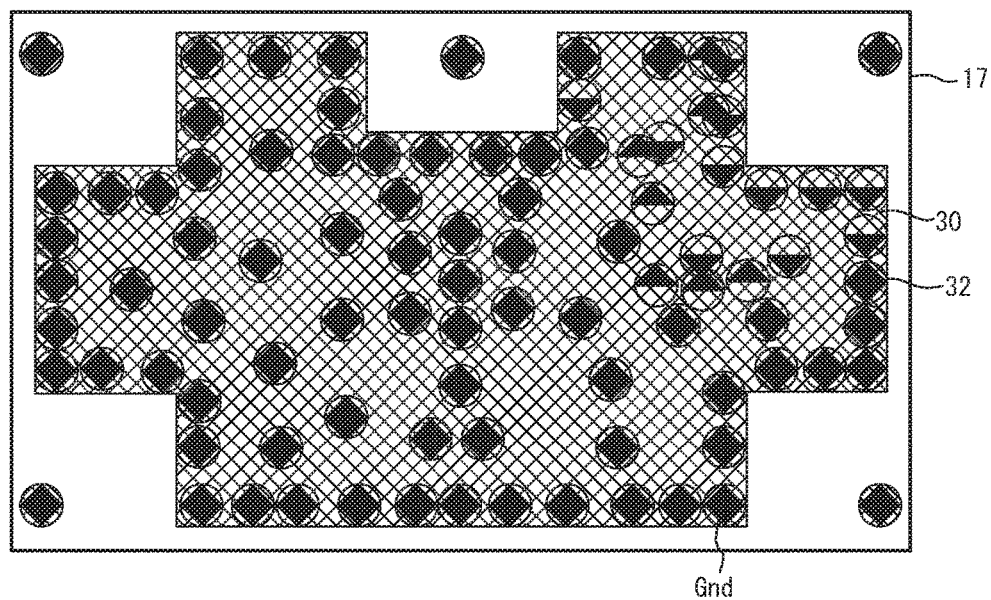
FIG. 16A and FIG. 16B are plan views (No. 4) of layers of the wiring substrate.
Figure 16B:
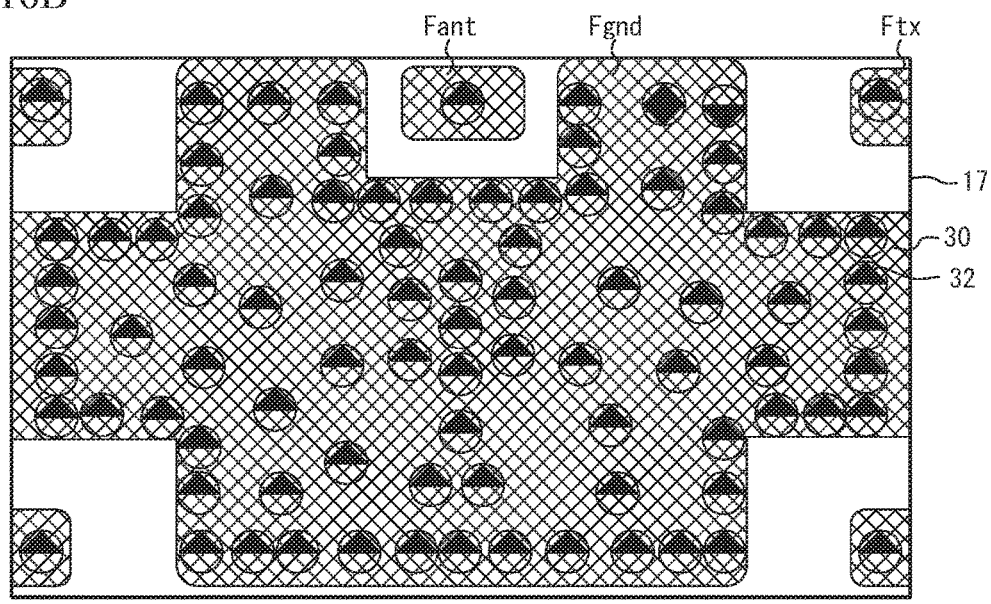

FIG. 13A through FIG. 16B are plan views of the layers of the wiring substrate. FIG. 13A through FIG. 16A respectively illustrate the upper surfaces of the layers 11 through 17. FIG. 16B is a transparent diagram of the lower surface of the layer 17 from above. Metal layers 30 are formed on the upper surface and the lower surface of each of the layers 11 through 17. Penetrating electrodes 32 penetrating through each of the layers 11 through 17 are formed. The penetrating electrode 32 connecting to the metal layer 30 from the upper side is indicated by an up-pointing triangle ▲ in the circle, and the penetrating electrode 32 connecting to the metal layer 30 from the lower side is indicated by a down-pointing triangle ▼ in the circle. The penetrating electrode 32 connecting to the metal layer 30 from the upper and lower sides is indicated by a rhomboid ♦ in the circle. The metal layers 30 and the penetrating electrodes 32 are formed of a metal layer such as a gold layer or a copper layer. The illustration of the metal layers 30 other than the metal layers 30 connecting to the transmit filter 80 is omitted.

Figure 13A:
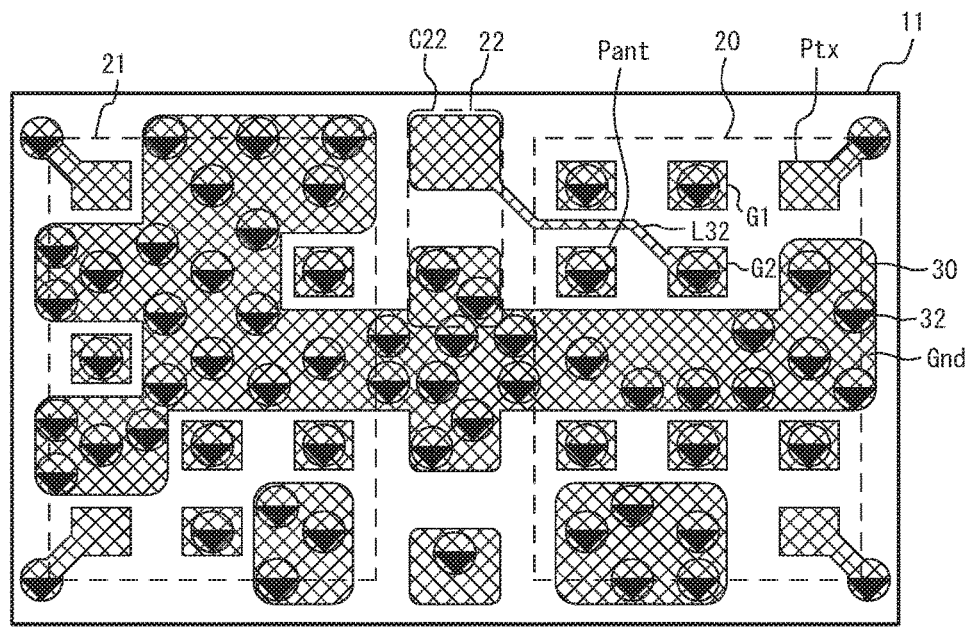
FIG. 13A and FIG. 13B are plan views (No. 1) of layers of a wiring substrate.
Figure 13B:
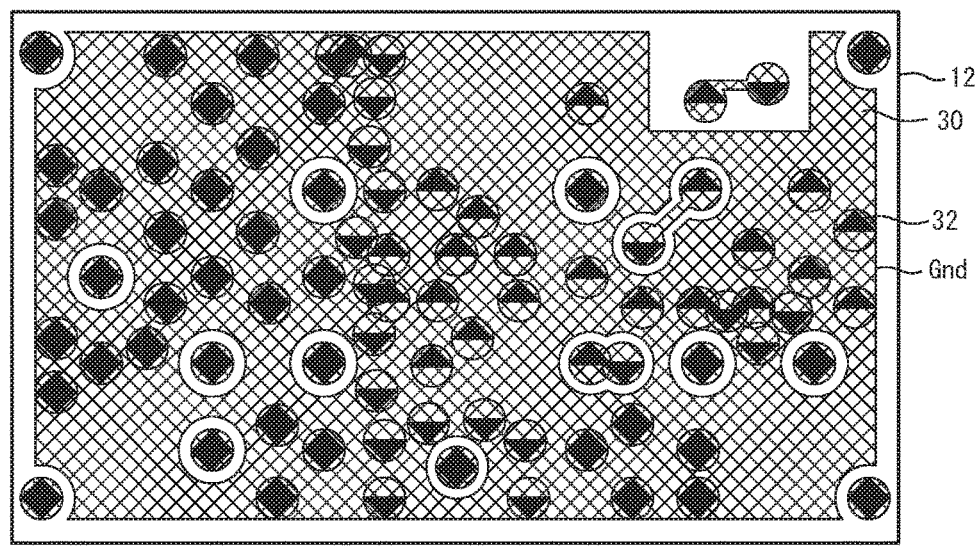

As illustrated in FIG. 13A, the filter chips 20 and 21 and the chip component 22 are mounted on the upper surface of the layer 11. The metal layer 30 forms a transmit pad Ptx, an antenna pad Pant, ground pads G1 and G2, and a ground wiring Gnd. The transmit pad Ptx, the antenna pad Pant, and the ground pads G1 and G2 correspond to the pads 24 of FIG. 12, and are connected to the pads corresponding to the transmit terminal Tx, the antenna terminal Ant, and the nodes N1 and N2 of FIG. 11B in the filter chip 20. The ground wiring Gnd is a wiring line to which a ground potential is supplied. The chip component 22 is a chip capacitor, and corresponds to the capacitor C22. The metal layer 30 forms a part of the inductor L32. As illustrated in FIG. 13B, the metal layer 30 forms the ground wiring Gnd on the upper surface of the layer 12.

Figure 14A:
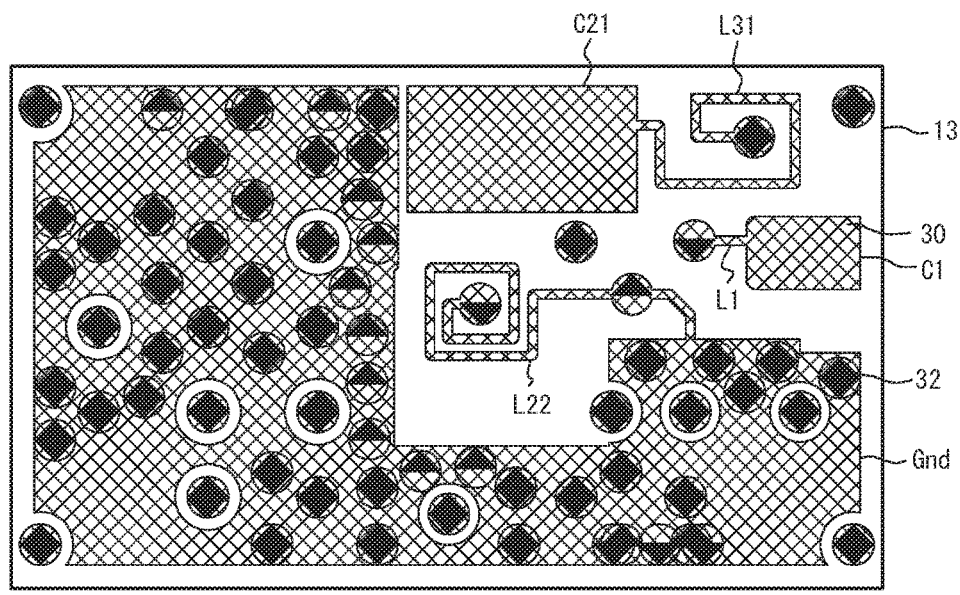
FIG. 14A and FIG. 14B are plan views (No. 2) of layers of the wiring substrate.
Figure 14B:
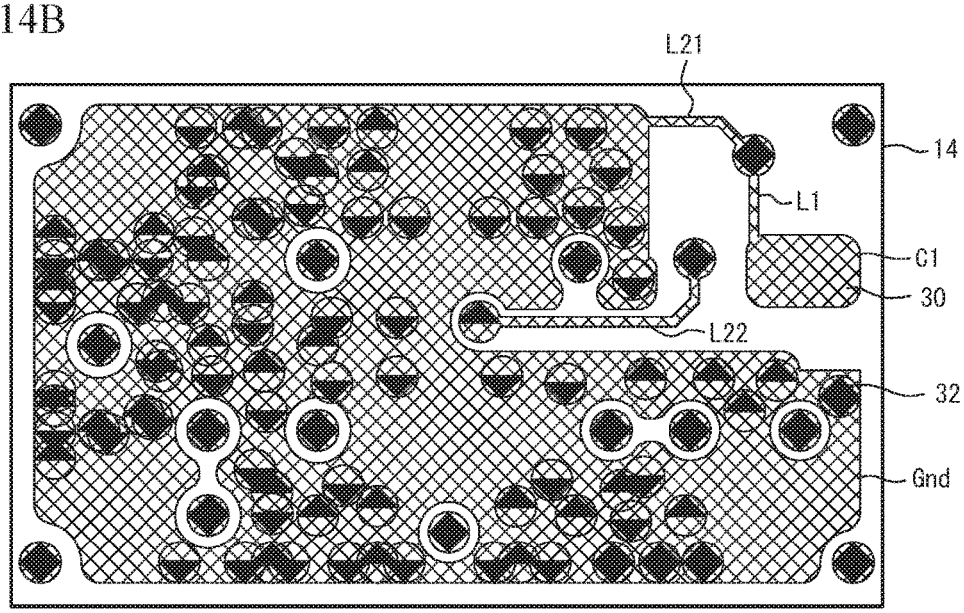

As illustrated in FIG. 14A, the metal layer 30 forms a part of each of the inductors L1, L22, and L31, the electrodes of the capacitors C1 and C21, and the ground wiring Gnd on the upper surface of the layer 13. As illustrated in FIG. 14B, the metal layer 30 forms a part of each of the inductors L1, L21, and L22, and the electrode of the capacitor C1 on the upper surface of the layer 14. As illustrated in FIG. 15A and FIG. 15B, the metal layer 30 forms a part of the inductor L1, the electrode of the capacitor C1, and the ground wiring Gnd on the upper surfaces of the layers 15 and 16.

As illustrated in FIG. 16A, the metal layer 30 forms the ground wiring Gnd on the upper surface of the layer 17. As illustrated in FIG. 16B, the metal layer 30 forms a transmit foot pad Ftx, an antenna foot pad Fant, and a ground foot pad Fgnd corresponding to the foot pads 26 of FIG. 12 on the lower surface of the layer 17.

The attenuation characteristic of the ladder-type filter of the second embodiment was simulated. The inductance of each inductor and the capacitance of each capacitor used for the simulation are as follows.
Resonant circuit R1: C1=0.75 pF, L1=1.0 nH
Resonant circuit R21: C21=1.2 pF, L21=0.33 nH, L31=1.3 nH
Resonant circuit R22: C21=10 pF, L21=0.15 nH, L31=0.001 nH As a second comparative example, a ladder-type filter without the resonant circuit R1 and the inductors L31 and L32 was also simulated.

Figure 17:
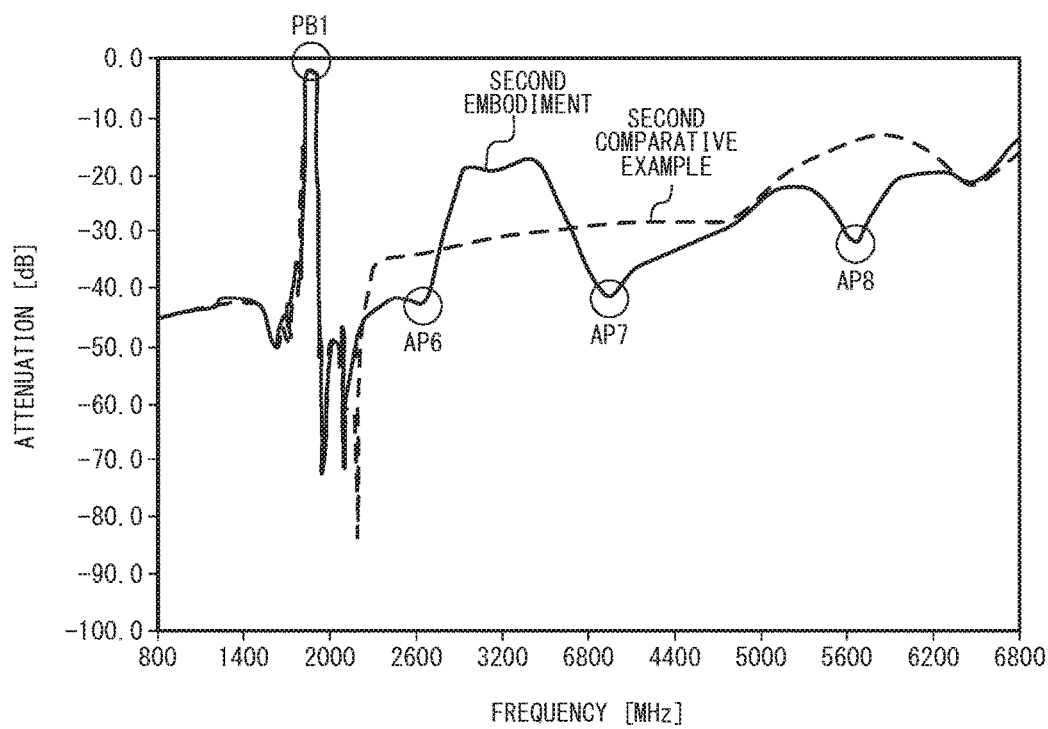
FIG. 17 illustrates the attenuation characteristics of ladder-type filters in accordance with the second embodiment and a second comparative example.

FIG. 17 illustrates the attenuation characteristics of the ladder-type filters of the second embodiment and the second comparative example. As illustrated in FIG. 17, the second embodiment forms attenuation poles AP6 through AP8 at frequencies higher than the passband PB1. The attenuation poles AP6 through AP8 respectively correspond to the band of the wireless LAN (Local Area Network), the second order harmonics of the passband, and the third order harmonics of the passband. As described above, two or more attenuation poles can be formed at desired frequencies.

Figure 18A:
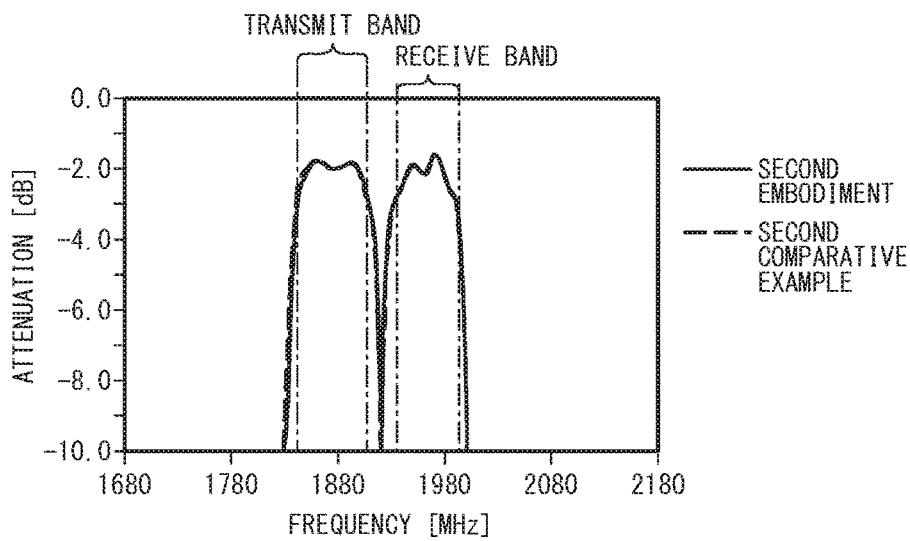
FIG. 18A through FIG. 18C illustrate the duplexer characteristics of the second embodiment and the second comparative example.
Figure 18B:
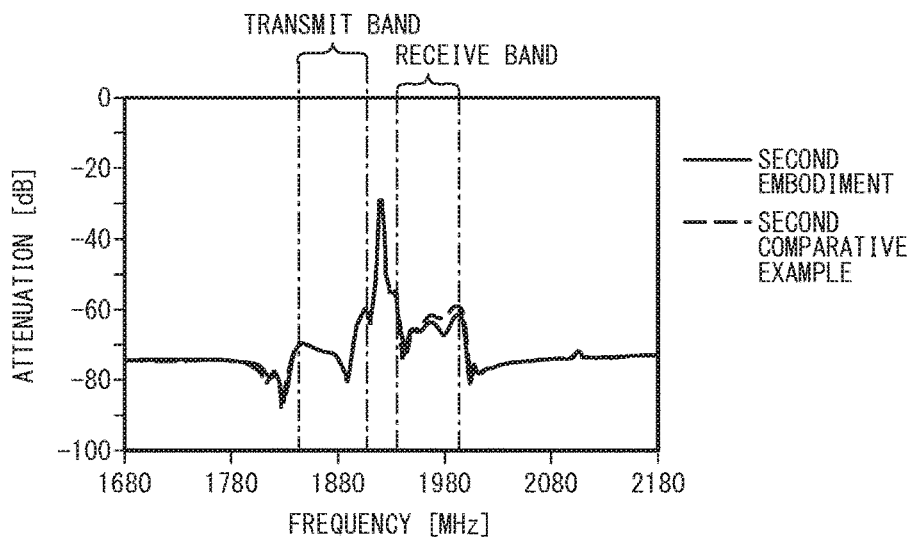
Figure 18C:
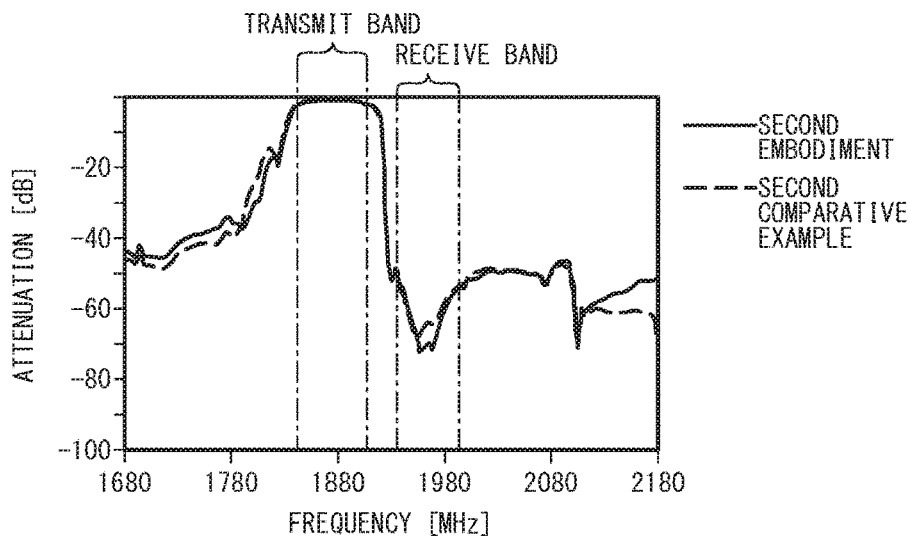

Simulated was a duplexer using the ladder-type filter of the second embodiment as the transmit filter 80 and using the receive filter 82 for band 2. FIG. 18A through FIG. 18C illustrate the duplexer characteristics of the second embodiment and the second comparative example. FIG. 18A illustrates the pass characteristics around the passband, FIG. 18B illustrates the isolation characteristics from the transmit terminal Tx to the receive terminal Rx, and FIG. 18C illustrates the pass characteristics of the transmit filters around the passband.

As illustrated in FIG. 18A through FIG. 18C, the pass characteristic and the isolation characteristic of the second embodiment around the passband are approximately the same as those of the second comparative example.

As described above, the second embodiment forms two or more steep attenuation poles without deteriorating the pass characteristic and the isolation characteristic around the passband compared to the second comparative example.

At least one of the inductors of the resonant circuits R1, R21, and R22 can be formed of the metal layer 30 in the wiring substrate 10. At least one of the capacitors of the resonant circuits R1, R21, and R22 can be formed by the electrode using the metal layers 30 sandwiching the layer in the wiring substrate 10. At least one of the inductors and the capacitors of the resonant circuits R1, R21, and R22 may be formed by a chip inductor or a chip capacitor mounted on the wiring substrate 10. As described above, at least one of the inductors and the capacitors of the resonant circuits R1, R21, and R22 can be a chip component mounted on the wiring substrate 10. At least one of the inductors and the capacitors of the resonant circuits R1, R21, and R22 can be formed in the wiring substrate 10.

Figure 19:
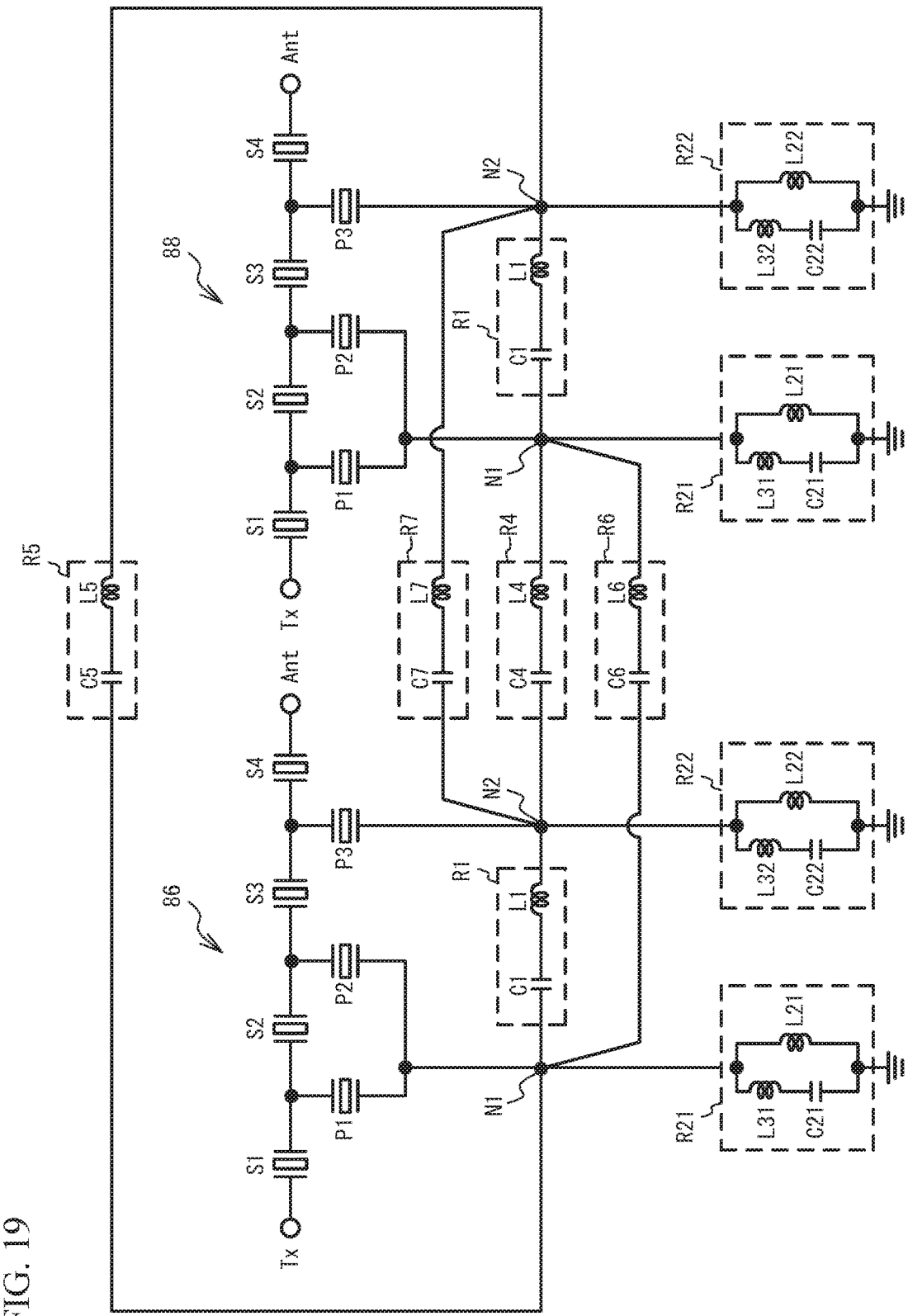
FIG. 19 is a circuit diagram of a ladder-type filter in accordance with a first variation of the second embodiment.

FIG. 19 is a circuit diagram of a ladder-type filter in accordance with a first variation of the second embodiment. Ladder-type filters 86 and 88 are provided. The ladder-type filter 86 is a transmit filter for band 2, and the ladder-type filter 88 is a transmit filter for band 4 (transmit band: 1710 to 1755 GHz, receive band: 2100 to 2155 GHz). The circuits of the ladder-type filters 86 and 88 are the same as those of the second embodiment. A resonant circuit R4 is connected between the node N2 of the ladder-type filter 86 and the node N1 of the ladder-type filter 88. A resonant circuit R5 is connected between the node N1 of the ladder-type filter 86 and the node N2 of the ladder-type filter 88. A resonant circuit R6 is connected between the node N1 of the ladder-type filter 86 and the node N1 of the ladder-type filter 88. A resonant circuit R7 is connected between the node N2 of the ladder-type filter 86 and the node N2 of the ladder-type filter 88. The resonant circuit R4 includes a capacitor C4 and an inductor L4 connected in series. The resonant circuit R5 includes a capacitor C5 and an inductor L5 connected in series. The resonant circuit R6 includes a capacitor C6 and an inductor L6 connected in series. The resonant circuit R7 includes a capacitor C7 and an inductor L7 connected in series.

The attenuation characteristic of the ladder-type filter of the first variation of the second embodiment was simulated. The inductance of each inductor and the capacitance of each capacitor of the ladder-type filter 86 are as follows.
Resonant circuit R1: C1=0.073 pF, L1=0.28 nH
Resonant circuit R4: C4=0.053 pF, L4=1.36 nH
Resonant circuit R5: C5=0.022 pF, L5=0.75 nH
Resonant circuit R6: C6=0.06 pF, L6=2.4 nH
Resonant circuit R7: C7=2.65 pF, L7=0.19 nH
Resonant circuit R21: C21=2.45 pF, L21=0.82 nH, L31=0.43 nH
Resonant circuit R22: C21=74 pF, L21=0.3 nH, L31=1.67 nH As a third comparative example, simulated was a ladder-type filter without the resonant circuits R1 and R4 to R7, and the inductors L31 and L32.

Figure 20A:
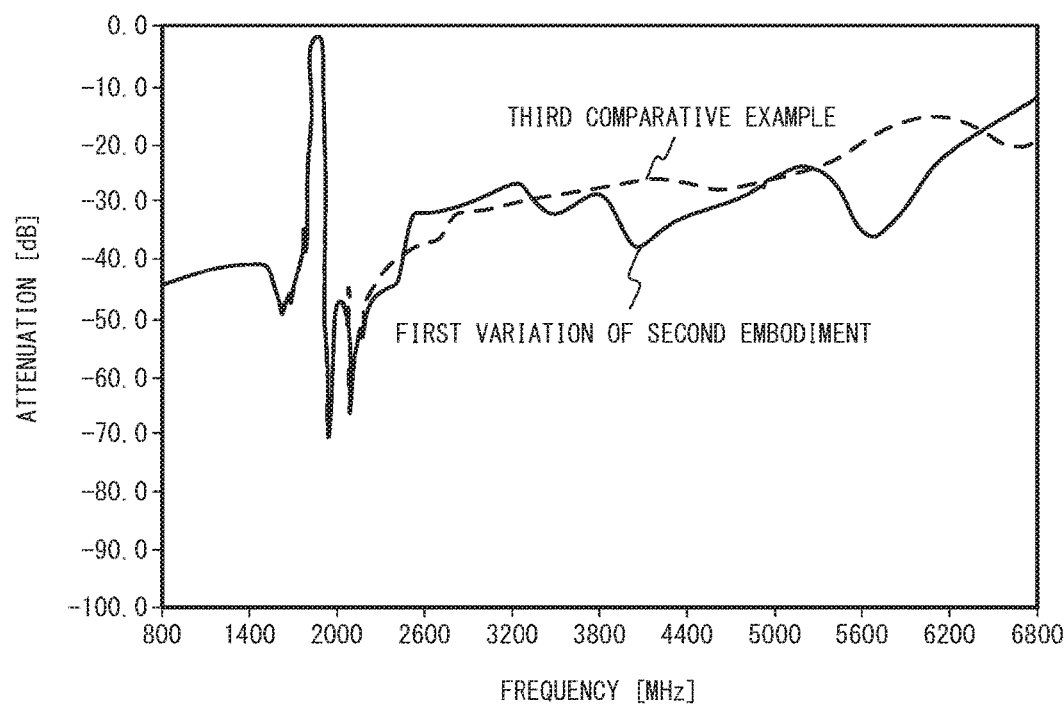
FIG. 20A and FIG. 20B illustrate the attenuation characteristics of ladder-type filters in accordance with the first variation of the second embodiment and a third comparative example.
Figure 20B:
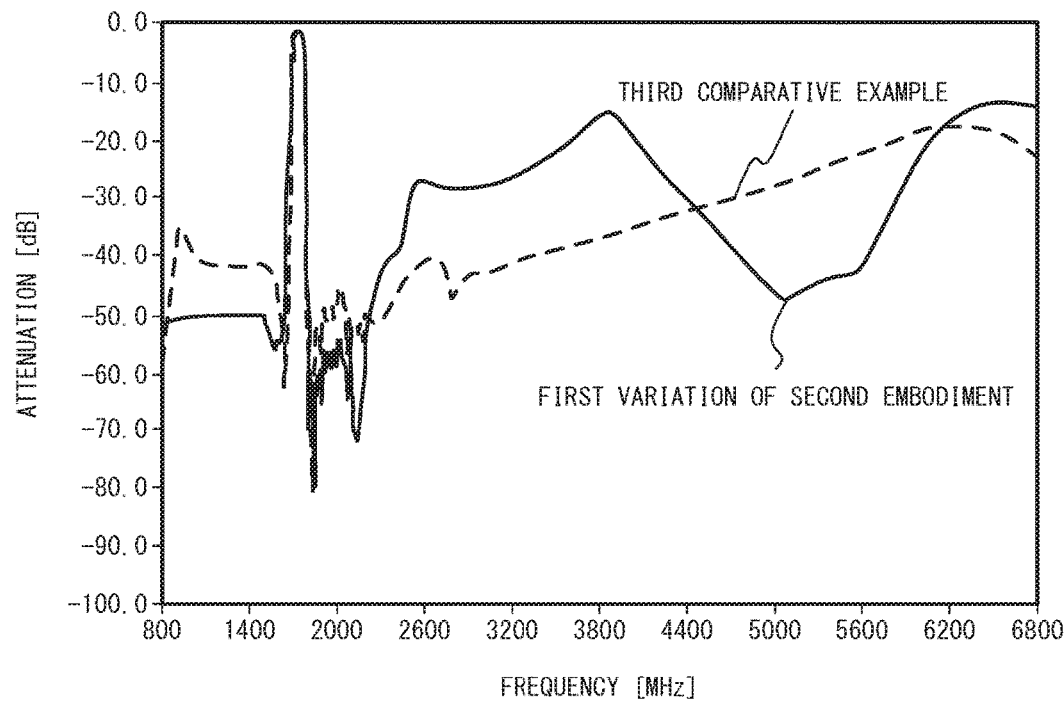

FIG. 20A and FIG. 20B illustrate the attenuation characteristics of the ladder-type filters of the first variation of the second embodiment and the third comparative example.

FIG. 20A and FIG. 20B respectively illustrate the attenuation characteristics of the ladder-type filters 86 for band 2 and the attenuation characteristics of the ladder-type filters 88 for band 4. As illustrated in FIG. 20A, the attenuation characteristic of the ladder-type filter 86 is the same as that of the second embodiment. In the first variation of the second embodiment, attenuation poles are formed at frequencies corresponding to the band of the wireless LAN, the second order harmonics of the passband, and the third order harmonics of the passband. As illustrated in FIG. 20B, in the first variation of the second embodiment, attenuation poles are formed at 5 GHz and at 5.5 GHz. Accordingly, the attenuation between the 4.5 GHz and 6 GHz is large. This frequency band corresponds to the third order harmonics of the passband and frequencies of the wireless LAN and the IMS (Industry Science Medical) band. Compared with the third comparative example, the attenuation characteristic is improved at frequencies lower than the passband.

Figure 21:
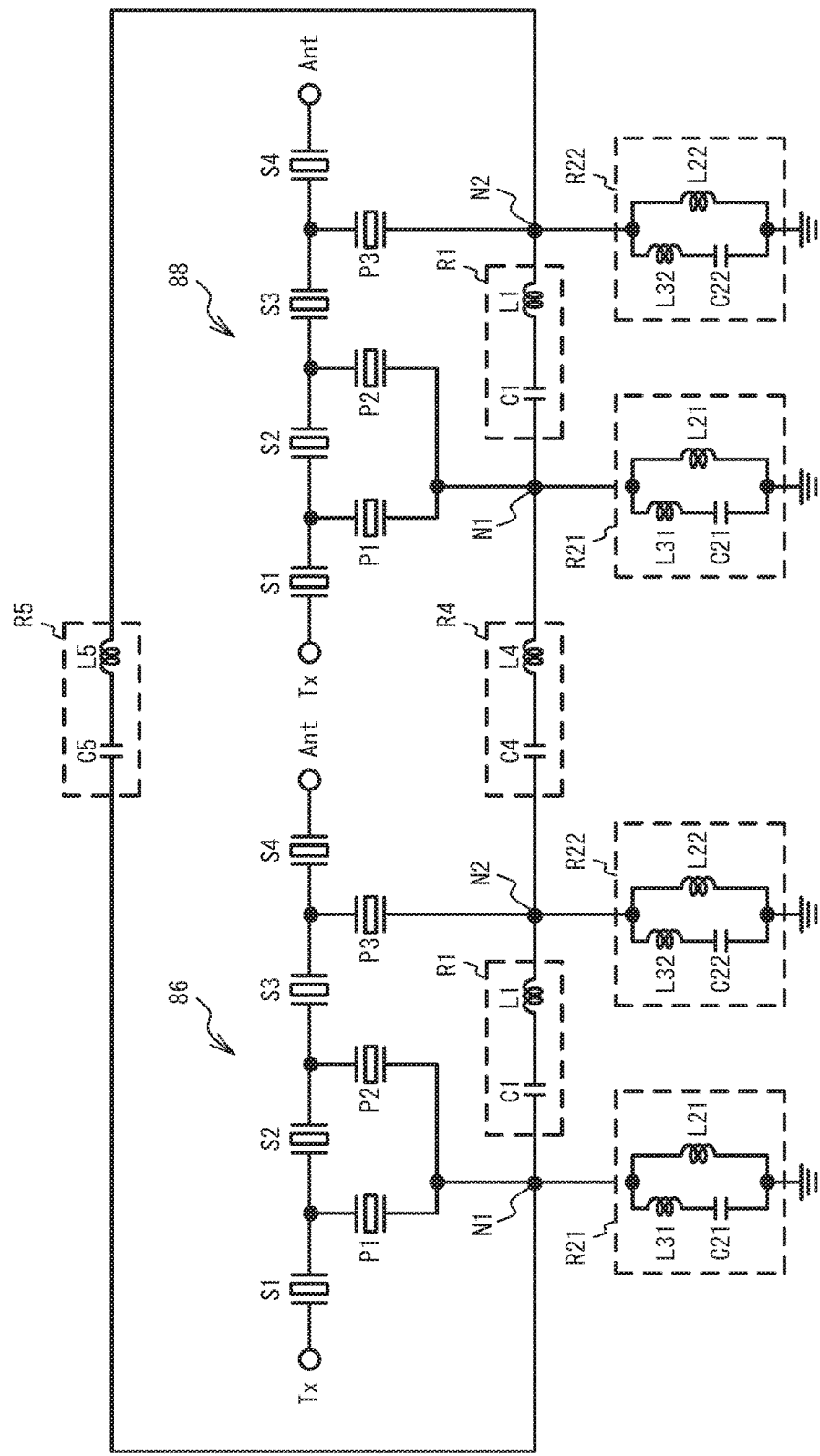
FIG. 21 is a circuit diagram of a ladder-type filter in accordance with a second variation of the second embodiment.

FIG. 21 is a circuit diagram of a ladder-type filter in accordance with a second variation of the second embodiment. As illustrated in FIG. 21, neither of the resonant circuits R6 and R7 is provided. Other configurations are the same as those of the first variation of the second embodiment, and the description thereof is omitted.

According to the first and second variations of the second embodiment, at least one of the resonant circuits R4 through R7 can be located between a node between the parallel resonator of the ladder-type filter 86 and ground and a node between the parallel resonator of the ladder-type filter 88 and ground.

At least one of the transmit filter 80 and the receive filter 82 of the duplexer illustrated in FIG. 11A may be the ladder-type filter according to any one of the first and second embodiments and their variations.

Third Embodiment

Figure 22:
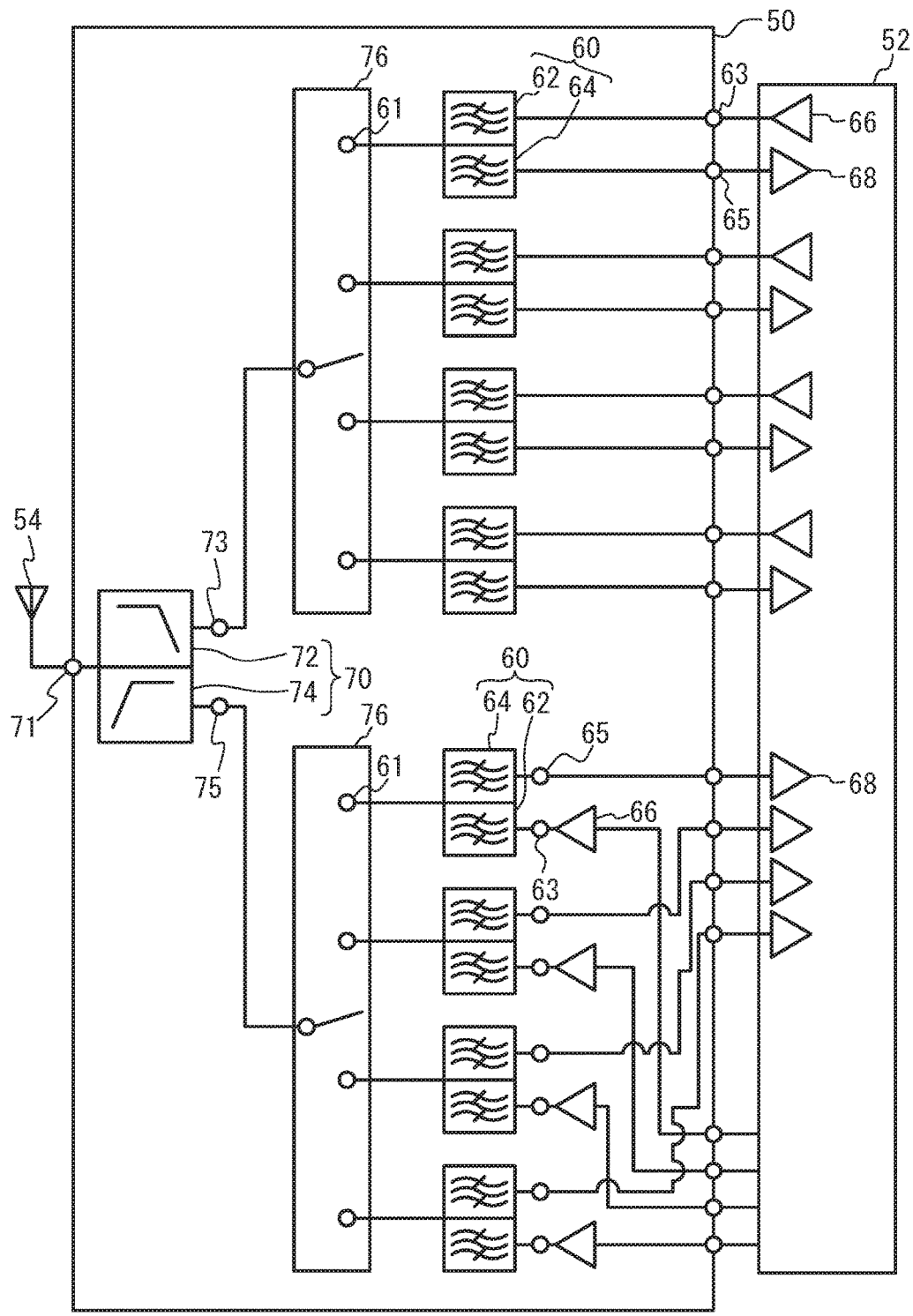
FIG. 22 is a block diagram of a system including a module in accordance with a third embodiment.

A third embodiment is an exemplary module including the ladder-type filter according to any one of the first and second embodiments. FIG. 22 is a block diagram of a system including a module in accordance with the third embodiment. As illustrated in FIG. 22, the system includes a module 50, an integrated circuit 52, and an antenna 54. The module 50 includes a diplexer 70, switches 76, duplexers 60, and power amplifiers 66. The diplexer 70 includes a low-pass filter (LPF) 72 and a high-pass filter (HPF) 74. The LPF 72 is connected between terminals 71 and 73. The HPF 74 is connected between terminals 71 and 75. The terminal 71 is connected to the antenna 54. The LPF 72 allows low-frequency signals of signals transmitted from/received by the antenna 54 to pass therethrough, and suppresses high-frequency signals. The HPF 74 allows high-frequency signals of signals transmitted from/received by the antenna 54 to pass therethrough, and suppresses low-frequency signals. The switch 76 connects the terminal 73 (or 75) to one terminal of terminals 61. The duplexer 60 includes a transmit filter 62 and a receive filter 64. The transmit filter 62 is connected between terminals 61 and 63. The receive filter 64 is connected between terminals 61 and 65. The transmit filter 62 allows signals within the transmit band to pass therethrough, and suppresses other signals. The receive filter 64 allows signals within the receive band to pass therethrough, and suppresses other signals. The power amplifier 66 amplifies and outputs transmission signals to the terminal 63. A low noise amplifier 68 amplifies reception signals output to the terminal 65.

At least one of the transmit filter 62 and the receive filter 64 of the duplexer 60 may be the filter according to any one of the first and second embodiments. The third embodiment describes a front end module for mobile communication terminals as an example of the module, but the module may be other kinds of modules.

The embodiments have described mainly a surface acoustic wave resonator as an example of the resonator, but the resonator may be a boundary acoustic wave resonator, a Love wave resonator, or a piezoelectric thin film resonator.

Although the embodiments of the present invention have been described in detail, it is to be understood that the various change, substitutions, and alterations could be made hereto without departing from the spirit and scope of the invention.

What is claimed is:

1. A ladder-type filter comprising:
   one or more series resonators connected in series between an input terminal and an output terminal;
   two or more parallel resonators connected in parallel between the input terminal and the output terminal;
   a first inductor connected in series between at least two nodes, each of the at least two nodes being located between a corresponding parallel resonator of at least two parallel resonators of the two or more parallel resonators and ground; and
   a first capacitor connected in series with the first inductor between the at least two nodes,
   wherein each of the at least two nodes is connected to the ground via neither the first inductor nor the first capacitor,
   each of the at least two nodes is connected to the corresponding parallel resonator via neither the first inductor nor the first capacitor, and
   any capacitor are not connected in parallel with the first inductor and the first capacitor between the at least two nodes.

2. The ladder-type filter according to claim 1, further comprising:
   a filter chip including the one or more series resonators and the two or more parallel resonators formed therein; and
   a substrate on which the filter chip is mounted,
   wherein at least one of the first inductor and the first capacitor is a chip component mounted on the substrate.

3. The ladder-type filter according to claim 1, further comprising:
   a filter chip including the one or more series resonators and the two or more parallel resonators formed therein; and
   a substrate on which the filter chip is mounted,
   wherein at least one of the first inductor and the first capacitor is formed in the substrate.

4. A duplexer comprising:
   a transmit filter connected between a transmit terminal and a common terminal; and
   a receive filter connected between a receive terminal and the common terminal,
   wherein at least one of the transmit filter and the receive filter is the ladder-type filter according to claim 1.

5. A module comprising:
   a ladder-type filter according to claim 1.

6. A ladder-type filter comprising:
   a first ladder-type filter being a ladder-type filter according to claim 1;

a second ladder-type filter being a ladder-type filter according to claim 1;
a second inductor connected in series between a first node being one of the at least two nodes in the first ladder-type filter and a second node being one of the at least two nodes in the second ladder-type filter; and
a second capacitor connected in series with the second inductor between the first node and the second node.

7. A ladder-type filter comprising:
one or more series resonators connected in series between an input terminal and an output terminal;
two or more parallel resonators connected in parallel between the input terminal and the output terminal;
a first inductor connected in series between at least two nodes, each of the at least two nodes being located between a corresponding parallel resonator of at least two parallel resonators of the two or more parallel resonators and ground;
a first capacitor connected in series with the first inductor between the at least two nodes;
a second inductor connected in series between at least one node of the at least two nodes and the ground; and
a second capacitor connected in parallel to the second inductor between the at least one node and the ground.

8. The ladder-type filter according to claim 7, further comprising:
a third inductor connected in parallel to the second inductor and connected in series with the second capacitor between the at least one node and the ground.

9. A ladder-type filter comprising:
one or more series resonators connected in series between an input terminal and an output terminal;
two or more parallel resonators connected in parallel between the input terminal and the output terminal;
a first inductor connected in series between at least two nodes, each of the at least two nodes being located between a corresponding parallel resonator of at least two parallel resonators of the two or more parallel resonators and ground;
a first capacitor connected in series with the first inductor between the at least two nodes;
second inductors, each of the second inductors being connected in series between a corresponding node of the at least two nodes and the ground; and
second capacitors, each of the second capacitors being connected in parallel to a corresponding second inductor of the second inductors between a corresponding node of the at least two nodes and the ground.

10. The ladder-type filter according to claim 9, further comprising:
third inductors, each of the third inductors being connected in parallel to a corresponding second inductor of the second inductors and connected in series with a corresponding second capacitor of the second capacitors between a corresponding node of the at least two nodes and the ground.

\* \* \* \* \*